(12) United States Patent
Misaki

(10) Patent No.: US 11,133,345 B2
(45) Date of Patent: Sep. 28, 2021

(54) ACTIVE MATRIX SUBSTRATE, X-RAY IMAGING PANEL WITH THE SAME, AND METHOD OF MANUFACTURING THE SAME

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 211 days.

(21) Appl. No.: 16/681,455

(22) Filed: Nov. 12, 2019

(65) Prior Publication Data

US 2020/0161360 A1    May 21, 2020

Related U.S. Application Data

(60) Provisional application No. 62/768,628, filed on Nov. 16, 2018.

(51) Int. Cl.
*H01L 27/146* (2006.01)
*G01T 1/20* (2006.01)
*H01L 29/786* (2006.01)

(52) U.S. Cl.
CPC ...... *H01L 27/14636* (2013.01); *G01T 1/2018* (2013.01); *H01L 27/14616* (2013.01); *H01L 27/14663* (2013.01); *H01L 27/14689* (2013.01); *H01L 29/7869* (2013.01)

(58) Field of Classification Search
CPC ............... G01T 1/2018; H01L 27/1225; H01L 27/1248; H01L 27/14616; H01L 27/14636; H01L 27/14659; H01L 27/14663; H01L 27/14689; H01L 27/14692; H01L 29/7869; H01L 31/02161; H01L 31/115; H01L 31/18
See application file for complete search history.

(56) References Cited

U.S. PATENT DOCUMENTS

2014/0353470 A1*  12/2014  Kawanabe ........ H01L 27/14692
                                                            250/208.1

FOREIGN PATENT DOCUMENTS

JP    2007-165865 A    6/2007
JP    2015-119113 A    6/2015

* cited by examiner

*Primary Examiner* — Mark R Gaworecki
(74) *Attorney, Agent, or Firm* — ScienBiziP, P.C.

(57) ABSTRACT

An active matrix substrate includes a first electrode, a photoelectric conversion element, and a second electrode on a substrate. The first electrode, the photoelectric conversion element, and the second electrode are covered with a first inorganic insulating film including a first opening on the second electrode. The first organic insulating film including a second opening is provided on the first inorganic insulating film, and a surface of the first organic insulating film inside the second opening is covered with a second inorganic insulating film including a third opening overlapping the first opening in a plan view. A conductive film in contact with the second electrode in the first opening is provided on the second inorganic insulating film.

6 Claims, 39 Drawing Sheets

ACTIVE MATRIX SUBSTRATE, X-RAY IMAGING PANEL WITH THE SAME, AND METHOD OF MANUFACTURING THE SAME

CROSS-REFERENCE TO RELATED APPLICATIONS

This application claims the benefit of priority to U.S. Provisional Application No. 62/768,628 filed on Nov. 16, 2018. The entire contents of the above-identified application are hereby incorporated by reference.

BACKGROUND

Technical Field

The disclosure disclosed below relates to an active matrix substrate, an X-ray imaging panel provided with the same, and a method for manufacturing an active matrix substrate.

JP 2007-165865 A discloses a photoelectric conversion device including a PIN photodiode as a photoelectric conversion element. In this photoelectric conversion device, a surface of the PIN photodiode is covered with a photosensitive resin film.

Since the photosensitive resin film easily absorbs moisture, in a case that moisture enters the photosensitive resin film in the photoelectric conversion device, the photosensitive resin film becomes a leak path, and a leakage current of the photoelectric conversion element easily flows between two electrodes in the PIN photodiode. As a result, sensor sensitivity of a portion where the leakage current is generated deteriorates, and a variation in detection accuracy occurs.

SUMMARY

An active matrix substrate, which is made in view of the above-described problem, includes a substrate, a first electrode disposed on the substrate, a photoelectric conversion element disposed on the first electrode, a second electrode disposed on the photoelectric conversion element, a first inorganic insulating film including a first opening on the second electrode and covering surfaces of the first electrode, the second electrode, and the photoelectric conversion element, a first organic insulating film provided on the first inorganic insulating film and including a second opening at a position overlapping the first opening in a plan view, a second inorganic insulating film covering a surface of the first organic insulating film inside the second opening and including a third opening at a position overlapping the first opening in a plan view, and a conductive film provided on the second inorganic insulating film and in contact with the second electrode in the first opening.

According to the above-described configuration, the leakage current of the photoelectric conversion element is less likely to flow, and a variation in detection accuracy is reduced.

BRIEF DESCRIPTION OF DRAWINGS

The disclosure will be described with reference to the accompanying drawings, wherein like numbers reference like elements.

DESCRIPTION OF EMBODIMENTS

Figure 1:
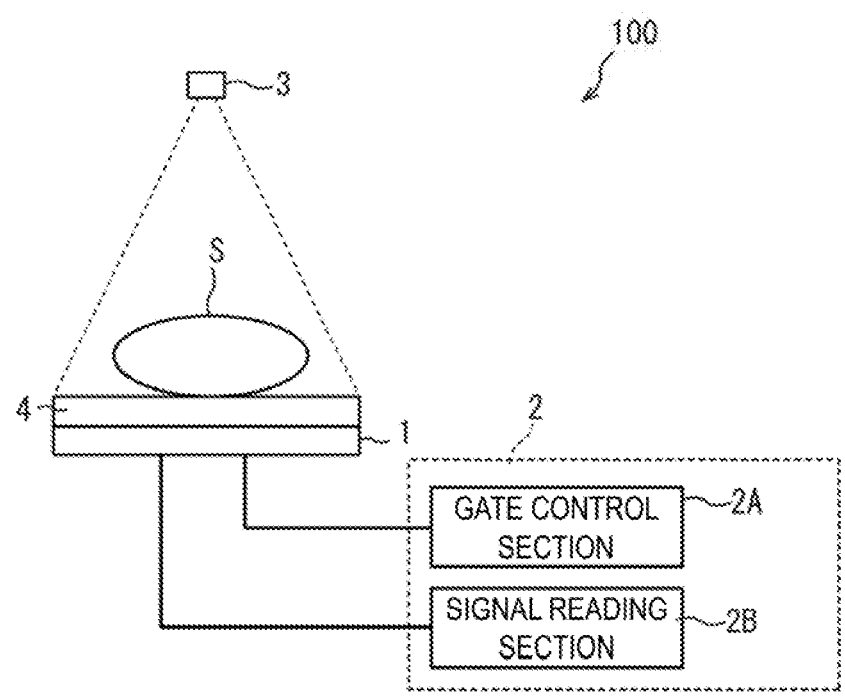
FIG. 1 is a schematic view illustrating an X-ray imaging device according to a first embodiment.

Hereinafter, embodiments of the present disclosure will be described in detail with reference to the accompanying drawings. In the drawings, identical or corresponding parts are denoted by the same reference signs, and the description thereof will not be repeated.

First Embodiment

Configuration

FIG. 1 is a schematic diagram illustrating an X-ray imaging device to which an active matrix substrate according to the present embodiment is applied. An X-ray imaging device 100 includes an active matrix substrate 1, a controller 2, an X-ray source 3, and a scintillator 4. In the present embodiment, an imaging panel includes at least the active matrix substrate 1 and the scintillator 4.

The controller 2 includes a gate control section 2A and a signal reading section 2B. X-rays are emitted from the X-ray source 3 to a subject S. X-rays passing through the subject S are converted into fluorescence (hereinafter, referred to as "scintillation light") in the scintillator 4 disposed on the top of the active matrix substrate 1. The X-ray imaging device 100 acquires an X-ray image by capturing an image of the scintillation light with the active matrix substrate 1 and the controller 2.

Figure 2:
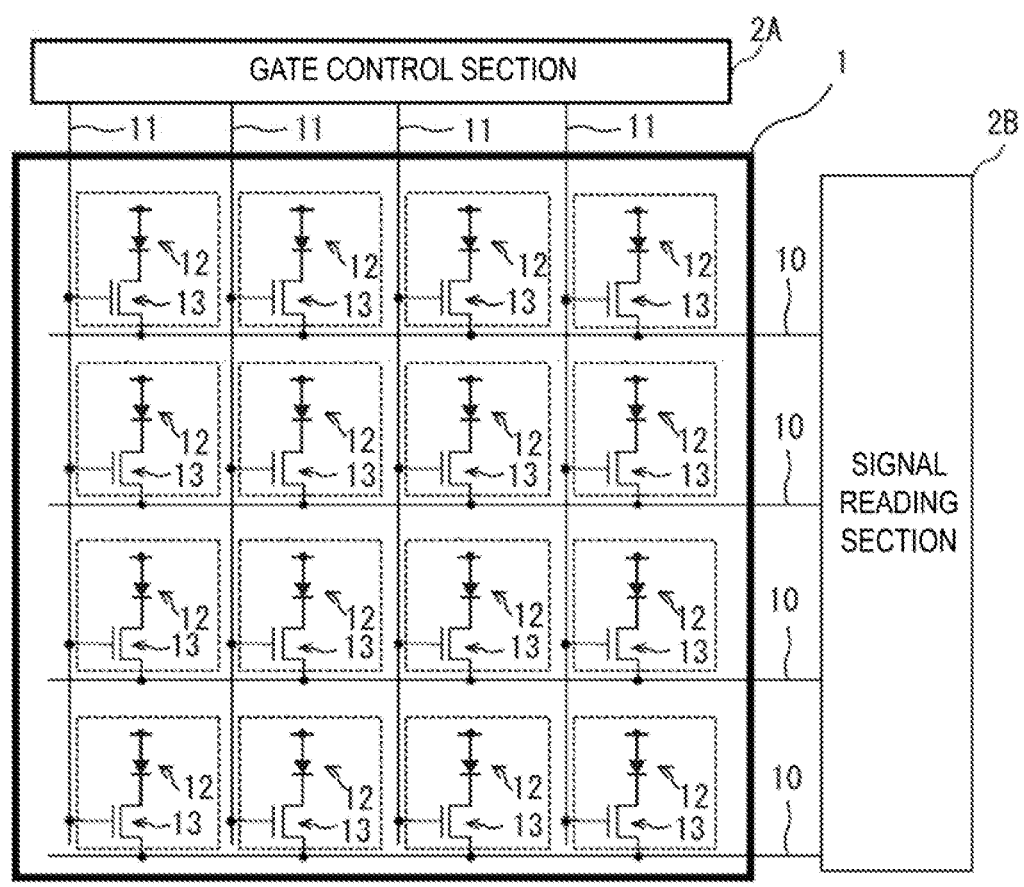
FIG. 2 is a schematic diagram illustrating a schematic configuration of an active matrix substrate illustrated in FIG. 1.

FIG. 2 is a schematic diagram illustrating a schematic configuration of the active matrix substrate 1. As illustrated in FIG. 2, a plurality of source wiring lines 10 and a plurality of gate wiring lines 11 that intersect the plurality of source wiring lines 10 are formed in the active matrix substrate 1. The gate wiring lines 11 are connected to the gate control section 2A, and the source wiring lines 10 are connected to the signal reading section 2B.

At positions at which the source wiring lines 10 and the gate wiring lines 11 intersect each other, the active matrix substrate 1 includes TFTs 13 connected to the source wiring lines 10 and the gate wiring lines 11. Photodiodes 12 are provided in regions surrounded by the source wiring lines 10 and the gate wiring lines 11 (hereinafter, pixels). In the pixels, the photodiodes 12 convert the scintillation light, which is obtained by converting the X-ray passing through the subject S, into electric charges depending on a light amount of the scintillation light.

Each of the gate wiring lines 11 is sequentially switched to a select state by the gate control section 2A, and the TFT 13 connected to the gate wiring line 11 in the select state turns to an on state. In a case where the TFT 13 is in the on state, a signal corresponding to the electric charge converted by the photodiode 12 is output to the signal reading section 2B via the source wiring line 10.

Figure 3:
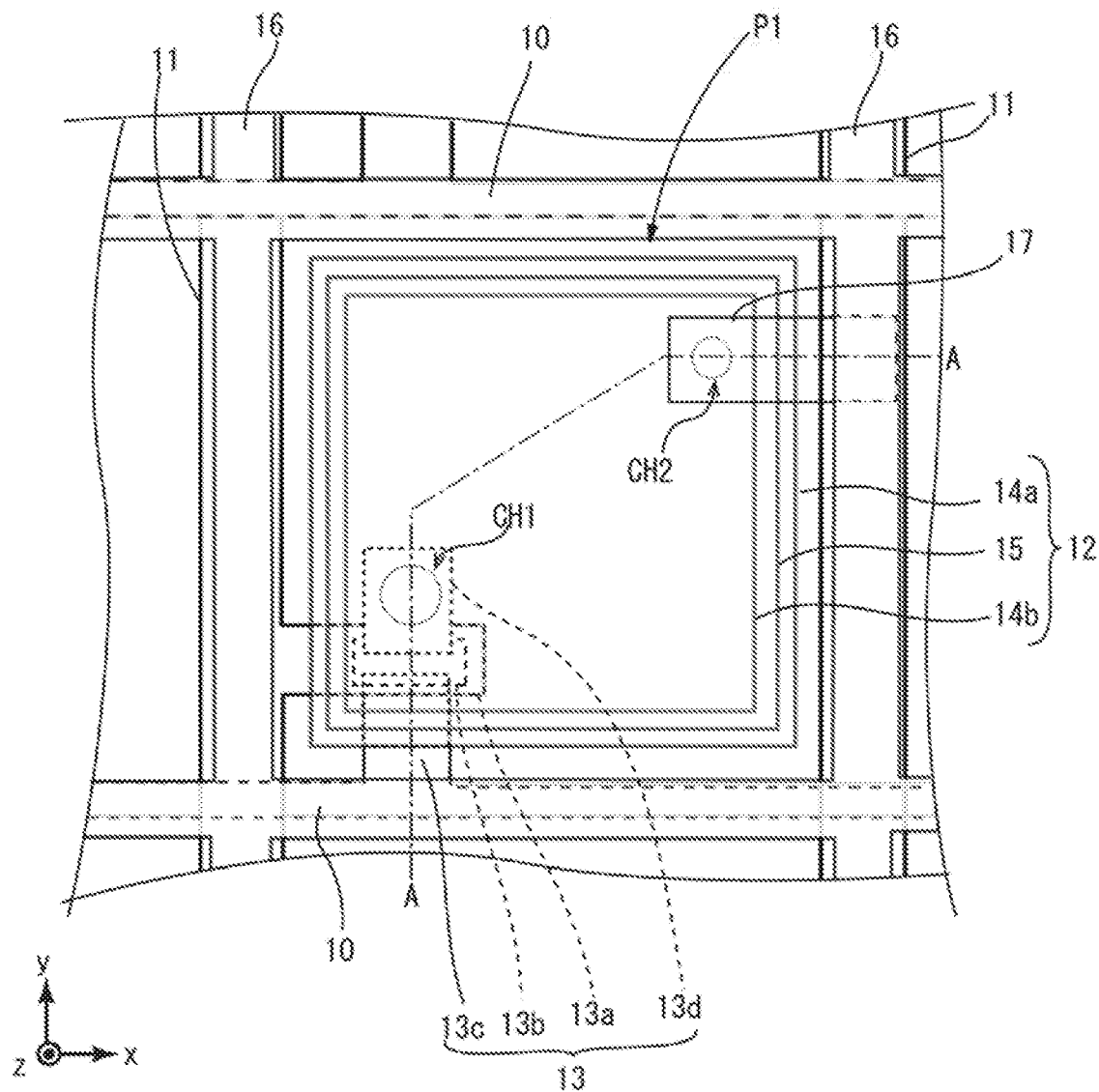
FIG. 3 is an enlarged plan view of a part of pixels of the active matrix substrate illustrated in FIG. 2.

FIG. 3 is an enlarged plan view of a part of pixels of the active matrix substrate 1 illustrated in FIG. 2.

As illustrated in FIG. 3, the photodiode 12 and the TFT 13 are provided in the pixel P1 surrounded by the gate wiring lines 11 and the source wiring lines 10.

The photodiode 12 includes a lower electrode (a cathode electrode) 14a, a photoelectric conversion layer 15, and an upper electrode (an anode electrode) 14b. The TFT 13 includes a gate electrode 13a connected to the gate wiring line 11, a semiconductor active layer 13b, a source electrode 13c connected to the source wiring line 10, and a drain electrode 13d. The drain electrode 13d and the lower electrode 14a are connected in a contact hole CH1.

Bias wiring lines 16 are arranged to overlap with the gate wiring lines 11 and the source wiring lines 10 in a plan view. The bias wiring lines 16 are connected to a transparent conductive film 17. The transparent conductive film 17 is connected to the photodiode 12 in a contact hole CH2. A bias voltage is supplied to the upper electrode 14b of the photodiode 12 via the transparent conductive film 17.

Figure 4:
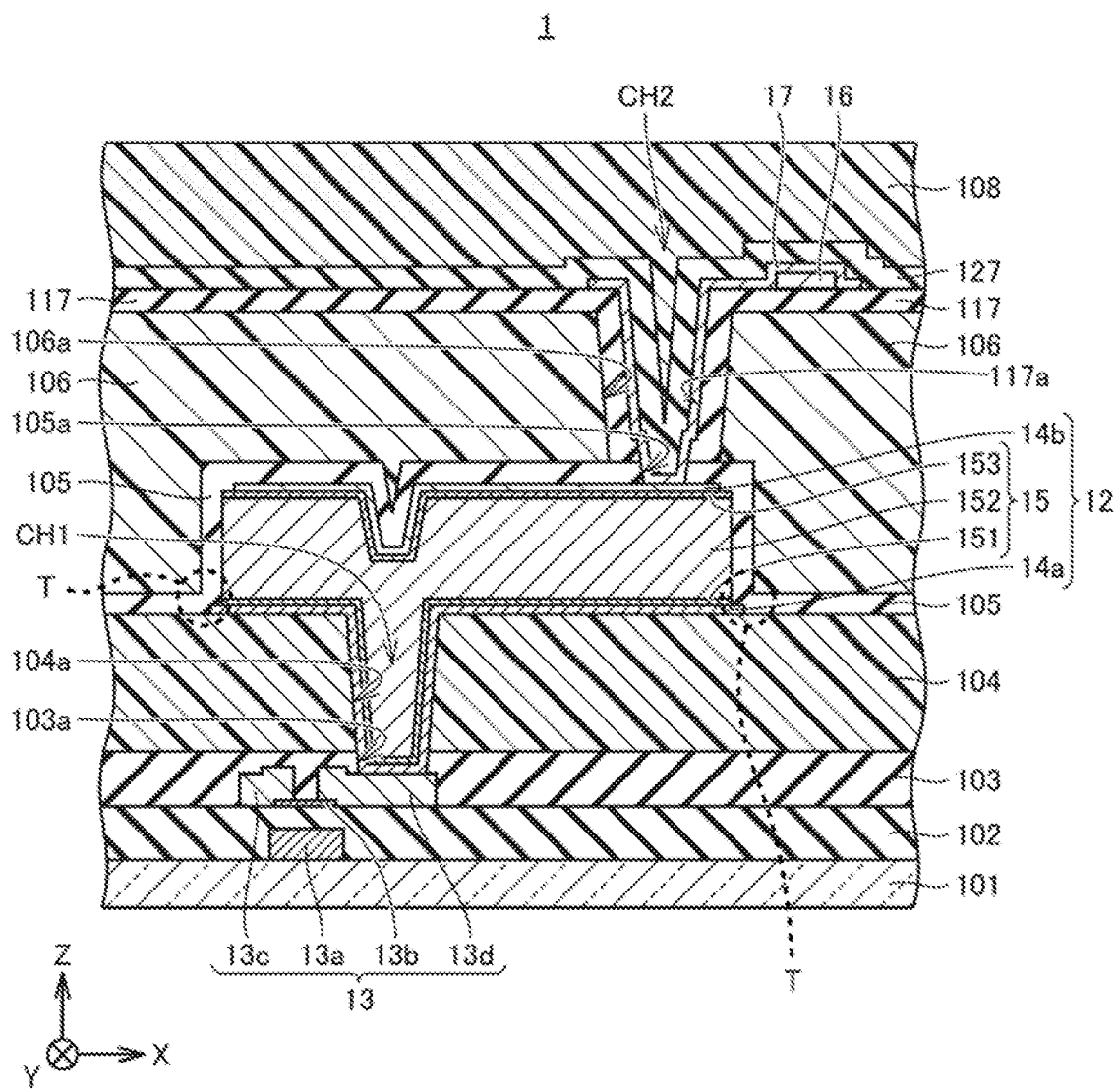
FIG. 4 is a cross-sectional view taken along line A-A in the pixel of FIG. 3.

Here, FIG. 4 illustrates a cross-sectional view taken along line A-A in the pixel P1 in FIG. 3. In FIG. 4, scintillation light converted by the scintillator 4 enters from a Z-axis positive direction side of the active matrix substrate 1. Note that, in the following description, the Z-axis positive direction side may be referred to as an upper side, and a Z-axis negative direction side may be referred to as a lower side.

As illustrated in FIG. 4, the gate electrode 13a and a gate insulating film 102 are formed on a substrate 101.

The substrate 101 is a substrate having insulating properties and is constituted by, for example, a glass substrate or the like.

In this example, the gate electrode 13a is formed of the same material as that of the gate wiring line 11 (see FIG. 3), and the gate electrode 13a and the gate wiring line 11 have, for example, a structure in which a metal film formed of aluminum (Al) and a metal film formed of molybdenum nitride (MoN) are layered. The film thicknesses of the aluminum (Al) and molybdenum nitride (MoN) are approximately 300 nm and approximately 100 nm, respectively. Note that the materials of the gate electrode 13a and the gate wiring line 11 are not limited thereto, and the gate electrode 13a and the gate wiring line 11 may have, for example, a structure in which an upper layer formed of copper (Cu) and a lower layer formed of titanium (Ti) are layered.

The gate insulating film 102 covers the gate electrode 13a. For the gate insulating film 102, for example, silicon oxide (SiOx), silicon nitride (SiNx), silicon oxynitride (SiOxNy) (x>y), silicon nitride oxide (SiNxOy) (x>y), and the like may be used. In the present embodiment, the gate insulating film 102 has a structure in which an insulating film formed of silicon oxide (SiOx) as an upper layer and an insulating film formed of silicon nitride (SiNx) as a lower layer are layered. The film thicknesses of the silicon oxide (SiOx) and the silicon nitride (SiNx) are approximately 50 nm and approximately 400 nm, respectively. However, the material and the film thickness of the gate insulating film 102 are not limited thereto.

The semiconductor active layer 13b is disposed above the gate electrode 13a with the gate insulating film 102 interposed therebetween. Further, the source electrode 13c and the drain electrode 13d separated from each other on the semiconductor active layer 13b are provided on the gate insulating film 102.

The semiconductor active layer 13b is formed in contact with the gate insulating film 102. The semiconductor active layer 13b is formed of an oxide semiconductor. For the oxide semiconductor, for example, $InGaO_3(ZnO)_5$, magnesium zinc oxide ($Mg_xZn_{1-x}O$), cadmium zinc oxide ($Cd_xZn_{1-x}O$), cadmium oxide (CdO), an amorphous oxide semiconductor containing indium (In), gallium (Ga), and zinc (Zn) in a predetermined ratio, or the like may be used. In this example, the semiconductor active layer 13b is formed of an amorphous oxide semiconductor containing indium (In), gallium (Ga), and zinc (Zn) in a predetermined ratio. The film thickness of the semiconductor active layer 13b is approximately 70 nm. Note that the material and the film thickness of the semiconductor active layer 13b are not limited thereto.

The source electrode 13c and the drain electrode 13d are formed of the same material as that of the source wiring line 10 and, for example, have a three-layer structure in which a metal film formed of molybdenum nitride (MoN), a metal film formed of aluminum (Al), and a metal film formed of titanium (Ti) are layered. The film thicknesses of these three layers are approximately 50 nm, 500 nm, and 100 nm in order from the lower layer side. However, the materials and the film thicknesses of the source electrode 13c and the drain electrode 13d are not limited thereto. The source electrode 13c and the drain electrode 13d may have a structure in which, for example, an upper layer formed of copper (Cu) and a lower layer formed of titanium (Ti) are layered.

A first insulating film 103 covering surfaces of the source electrode 13c and the drain electrode 13d and the surface of the semiconductor active layer 13b is provided on the gate insulating film 102. The first insulating film 103 has an opening 103a on the drain electrode 13d. The first insulating film 103 is constituted by an inorganic insulating film formed of, for example, silicon nitride (SiN) and has a film thickness of approximately 330 nm.

A second insulating film 104 is provided on the first insulating film 103. The second insulating film 104 includes an opening 104a above the drain electrode 13d at a position overlapping the opening 103a in a plan view.

The contact hole CH1 is constituted by the opening 103a of the first insulating film 103 and the opening 104a of the second insulating film 104.

The second insulating film 104 is formed of an organic transparent resin such as an acrylic resin or a siloxane resin, and the film thickness thereof is approximately 2.5 µm. Note that the material and the film thickness of the second insulating film 104 are not limited thereto.

The lower electrode (the cathode electrode) 14a is provided on the second insulating film 104. The lower electrode 14a and the drain electrode 13d are connected in the contact hole CH1. The lower electrode 14a is constituted by, for example, a metal film containing molybdenum nitride (MoN) and has a film thickness of approximately 200 nm. Note that the material and the film thickness of the lower electrode 14b are not limited thereto.

The photoelectric conversion layer 15 is provided on the lower electrode 14a. The photoelectric conversion layer 15 is a PIN diode in which an n-type amorphous semiconductor layer 151, an intrinsic amorphous semiconductor layer 152, and a p-type amorphous semiconductor layer 153 are sequentially layered.

In this example, the length of the photoelectric conversion layer 15 in the X-axis direction is less than the length of the lower electrode 14a in the X-axis direction. That is, the lower electrode 14a protrudes from the side surface of the photoelectric conversion layer 15 toward an outer side of the photoelectric conversion layer 15. Note that the relationship between the lengths of the photoelectric conversion layer 15 and the lower electrode 14a in the X-axis direction is not limited thereto. The lengths of the photoelectric conversion layer 15 and the lower electrode 14a in the X-axis direction may be equal.

The n-type amorphous semiconductor layer 151 is formed of amorphous silicon doped with n-type impurities (e.g., phosphorus). The n-type amorphous semiconductor layer 151 is in contact with the lower electrode 14a.

The intrinsic amorphous semiconductor layer 152 is formed of intrinsic amorphous silicon. The intrinsic amorphous semiconductor layer 152 is in contact with the n-type amorphous semiconductor layer 151.

The p-type amorphous semiconductor layer 153 is formed of amorphous silicon doped with p-type impurities (e.g., boron). The p-type amorphous semiconductor layer 153 is in contact with the intrinsic amorphous semiconductor layer 152.

In this example, the film thicknesses of the n-type amorphous semiconductor layer 151, the intrinsic amorphous semiconductor layer 152, and the p-type amorphous semiconductor layer 153 are approximately 30 nm, approximately 1000 nm, and approximately 5 nm, respectively. Note that the materials and the film thicknesses used for these semiconductor layers are not limited thereto.

The upper electrode 14b is provided on the p-type amorphous semiconductor layer 153 of the photoelectric conversion layer 15. The upper electrode 14b is constituted by a transparent conductive film formed of Indium Tin Oxide (ITO), Indium Zinc Oxide (IZO), or the like, for example. The film thickness of the upper electrode 14b is approximately 70 nm. Note that the material and the film thickness of the upper electrode 14b are not limited thereto.

The photodiode 12 is constituted by the lower electrode 14a, the photoelectric conversion layer 15, and the upper electrode 14b.

A third insulating film 105 is provided on the second insulating film 104 to cover the surface of the photodiode 12. The third insulating film 105 includes an opening 105a at a position overlapping the upper electrode 14b in a plan view. The third insulating film 105 is provided to be continuous with adjacent pixels P1 outside the opening 105a. The third insulating film 105 is constituted by an inorganic insulating film formed of, for example, silicon nitride (SiN) and has a film thickness of approximately 300 nm. Note that the material and the film thickness of the third insulating film 105 are not limited thereto.

A fourth insulating film 106 is provided on the third insulating film 105. The fourth insulating film 106 includes an opening 106a that overlaps the opening 105a in a plan view and has an opening width greater than that of the opening 105a. The fourth insulating film 106 is provided to be continuous with adjacent pixels P1 outside the opening 106a. The fourth insulating film 106 is formed of an organic transparent resin formed of, for example, an acrylic resin or a siloxane resin, and the film thickness is, for example, approximately 2.5 μm. Note that the material and the film thickness of the fourth insulating film 106 are not limited thereto.

A 5a-th insulating film 117 including an opening 117a at a position overlapping the opening 105a in a plan view is provided on the fourth insulating film 106. The contact hole CH2 is constituted by the opening 117a and the opening 105a. The 5a-th insulating film 117 covers the surface of the fourth insulating film 106 inside the opening 117a and is provided to be continuous with adjacent pixels outside the opening 117a. That is, the 5a-th insulating film 117 covers the entire photodiode 12 except for the portion where the contact hole CH2 is formed. The 5a-th insulating film 117 is constituted by an inorganic insulating film formed of, for example, silicon nitride (SiN) and has a film thickness of approximately 300 nm. Note that the material and the film thickness of the 5a-th insulating film 117 are not limited thereto.

The bias wiring line 16 is provided on the 5a-th insulating film 117 at a position that does not overlap the photodiode 12 in a plan view. The bias wiring line 16 is connected to the controller 2 (see FIG. 1). The bias wiring line 16 has a layered structure in which, in order from the lower layer, metal films of titanium (Ti), aluminum (Al), and molybdenum nitride (MoN) are layered. The film thicknesses of the titanium (Ti), aluminum (Al), and molybdenum nitride (MoN) are approximately 50 nm, approximately 300 nm, and approximately 100 nm, respectively. However, the material and the film thickness of the bias wiring line 16 are not limited thereto.

In addition, the transparent conductive film 17 that is connected to the upper electrode 14b in the opening 105a and covers the bias wiring line 16 is provided on the 5a-th insulating film 117. The transparent conductive film 17 is formed of, for example, ITO, and has a film thickness of approximately 70 nm. Note that the material and the film thickness of the transparent conductive film 17 are not limited thereto. The bias voltage input from the controller 2 to the bias wiring line 16 is applied to the upper electrode 14b via the transparent conductive film 17.

A 5b-th insulating film 127 is provided to cover the surface of the transparent conductive film 17 and the surface of the 5a-th insulating film 117. The 5b-th insulating film 127 is provided to be continuous with adjacent pixels P1. The 5b-th insulating film 127 is constituted by an inorganic insulating film formed of, for example, silicon nitride (SiN) and has a film thickness of approximately 300 nm.

Note that in this example, the 5a-th insulating film 117 and the 5b-th insulating film 127 are formed of the same material and have equivalent film thicknesses, but the material and the film thicknesses are not limited thereto. The 5a-th insulating film 117 and the 5b-th insulating film 127 may be formed of different materials as long as they are the inorganic insulating films, and the film thicknesses need not be equal.

A sixth insulating film 108 is provided to cover the 5b-th insulating film 127. The sixth insulating film 108 is provided to be continuous with adjacent pixels P1. The sixth insulating film 108 is formed of an organic transparent resin formed of, for example, an acrylic resin or a siloxane resin, and the film thickness is, for example, approximately 2.0 μm. Note that the material and the film thickness of the sixth insulating film 108 are not limited thereto.

In FIG. 4, since the portion of the third insulating film 105 indicated by a dashed line frame T is not flat, the film thickness becomes thinner than that of other portions or is easily formed in a discontinuous manner. In particular, in the present embodiment, since the width of the lower electrode 14a in the X-axis direction is greater than that of the photoelectric conversion layer 15, the portion indicated by the dashed line frame T is likely to be formed discontinuously compared to a case in which the widths of the lower electrode 14a and the photoelectric conversion layer 15 in the X-axis direction are equal. The surface of the third insulating film 105 is covered with the fourth insulating film 106, and the fourth insulating film 106 is constituted by an organic resin film. As a result, moisture readily enters the fourth insulating film 106 from scratches formed in the surface of the active matrix substrate 1, or moisture readily enters the fourth insulating film 106 during manufacturing of the active matrix substrate 1. When moisture permeates the fourth insulating film 106, the surface of the third insulating film 105 is exposed to the moisture, and the moisture enters the discontinuous portion (the dashed line frame T) of the third insulating film 105. In this case, the current easily flows to the surface of the third insulating film and the discontinuous portion (the dashed line frame T).

In a case that the 5a-th insulating film 117 is not provided, and the transparent conductive film 17 is in direct contact with the fourth insulating film 106, a leak path is formed to the transparent conductive film 17, and a leakage current of the photoelectric conversion layer 15 easily flows between the upper electrode 14b and the lower electrode 14a via the transparent conductive film 17.

In the present embodiment, the surface of the fourth insulating film 106 inside the opening 106a is covered with the 5a-th insulating film 117, and the transparent conductive film 17 and the bias wiring line 16 are provided on the 5a-th insulating film 117. That is, the transparent conductive film 17 and the bias wiring line 16 are not in direct contact with the fourth insulating film 106. For this reason, a leak path is not formed to the transparent conductive film 17, and leakage current does not flow between the upper electrode 14b and the lower electrode 14a via the transparent conductive film 17, a variation in sensor sensitivity is reduced, and detection accuracy of X-rays can be improved.

In addition, in the present embodiment, the 5b-th insulating film 127, which is an inorganic insulating film, is provided on the 5a-th insulating film 117 to cover the transparent conductive film 17. For this reason, in a case that scratches are formed in a part of the 5a-th insulating film 117, moisture hardly permeates from the fourth insulating film 106 to the sixth insulating film 108 via scratches in the 5a-th insulating film 117 even in a case where moisture permeates the fourth insulating film 106. That is, a leak path is less likely to be formed through the fourth insulating film 106 and the sixth insulating film 108, and the leakage current of the photoelectric conversion layer 15 is less likely to flow between the lower electrode 14a and the upper electrode 14b. On the other hand, in a case that the 5b-th insulating film 127 is not provided, moisture permeates the sixth insulating film 108 from the fourth insulating film 106 via the scratches in the 5a-th insulating film 117, and a leak path is easily formed through the fourth insulating film 106 and the sixth insulating film 108. As a result, a leakage current readily flows between the upper electrode 14b and the lower electrode 14a via the transparent conductive film 17.

Method for Manufacturing Active Matrix Substrate 1

Figure 5A:
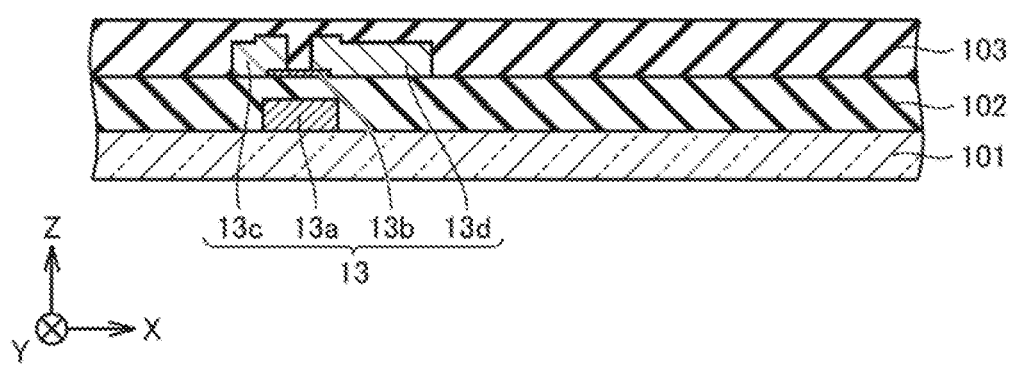
FIG. 5A is a cross-sectional view illustrating a step of manufacturing a pixel of the active matrix substrate illustrated in FIG. 4 and is a cross-sectional view illustrating a state in which a gate insulating film, a TFT, and an inorganic insulating film serving as the first insulating film, which are illustrated in FIG. 4, are formed.
Figure 5B:
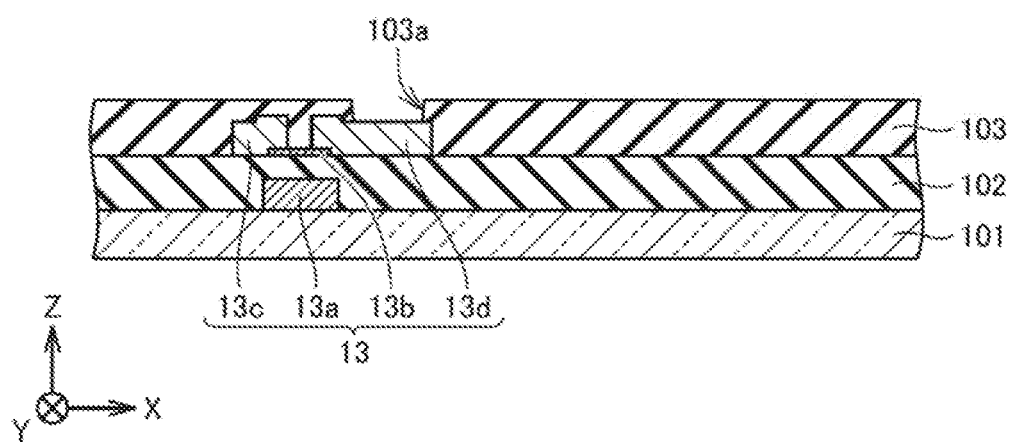
FIG. 5B is a cross-sectional view illustrating a step of patterning the inorganic insulating film illustrated in FIG. 5A to form an opening of the first insulating film.

Next, a method for manufacturing an active matrix substrate 1 will be described with reference to FIG. 5A to FIG. 5T. FIGS. 5A to 5T illustrate cross-sectional views (a cross-section A-A in FIG. 3) illustrating steps of manufacturing pixels P1 of the active matrix substrate 1.

First, the gate insulating film 102 and the TFT 13 are formed on the substrate 101 using known methods. Thereafter, the first insulating film 103 formed of silicon nitride (SiN) is formed on the gate insulating film 102 to cover the source electrode 13c and the drain electrode 13d using, for example, a plasma CVD method (see FIG. 5A).

Next, the entire surface of the substrate 101 is subjected to heat treatment at approximately 350° C., a photolithography method and dry etching using a fluorine gas are performed, and the first insulating film 103 is patterned (see FIG. 58). As a result, the opening 103a of the first insulating film 103 is formed on the drain electrode 13d.

Figure 5C:
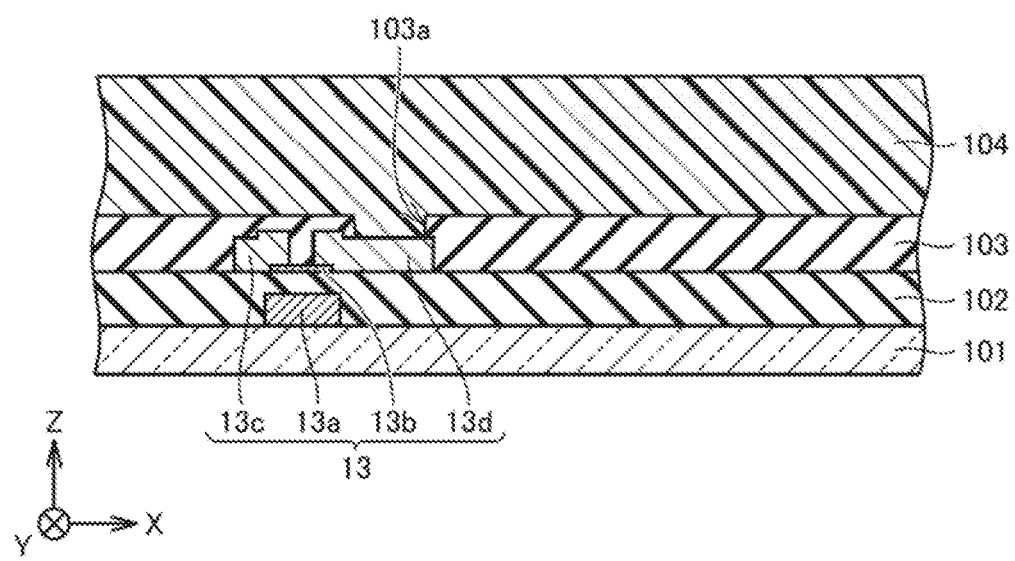
FIG. 5C is a cross-sectional view illustrating a step of forming a second insulating film illustrated in FIG. 4.
Figure 5D:
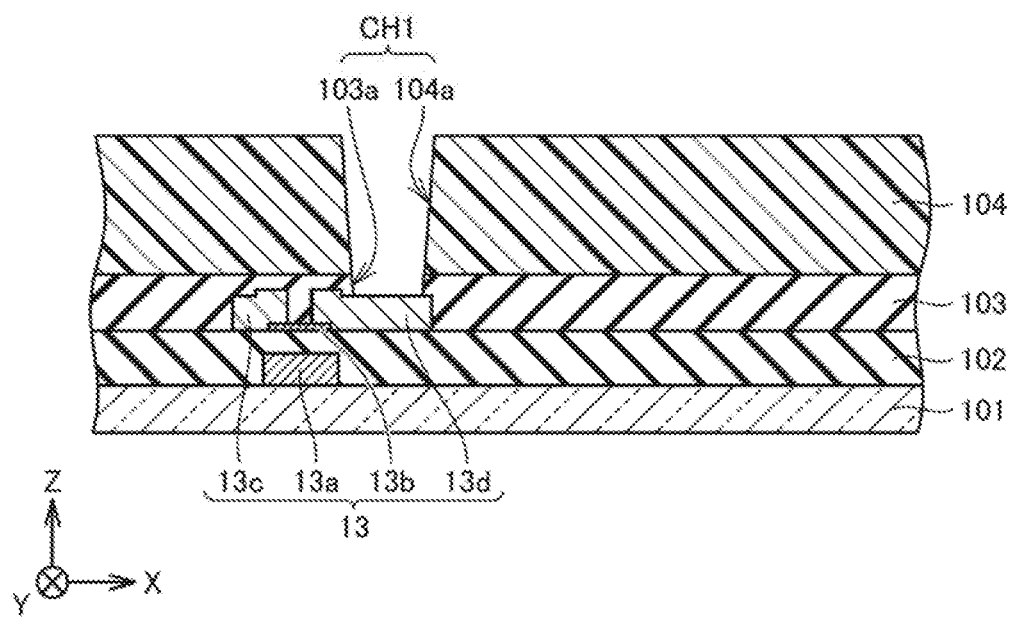
FIG. 5D is a cross-sectional view illustrating a step of forming an opening of the second insulating film illustrated in FIG. 5C.

Next, the second insulating film 104 formed of an acrylic resin or a siloxane resin is formed on the first insulating film 103 by, for example, a slit coating method (see FIG. 5C). Thereafter, the second insulating film 104 is patterned using a photolithography method (see FIG. 5D). As a result, the opening 104a of the second insulating film 104 is formed at a position overlapping the opening 103a in a plan view, and the contact hole CH1 constituted by the openings 103a and 104a is formed.

Figure 5E:
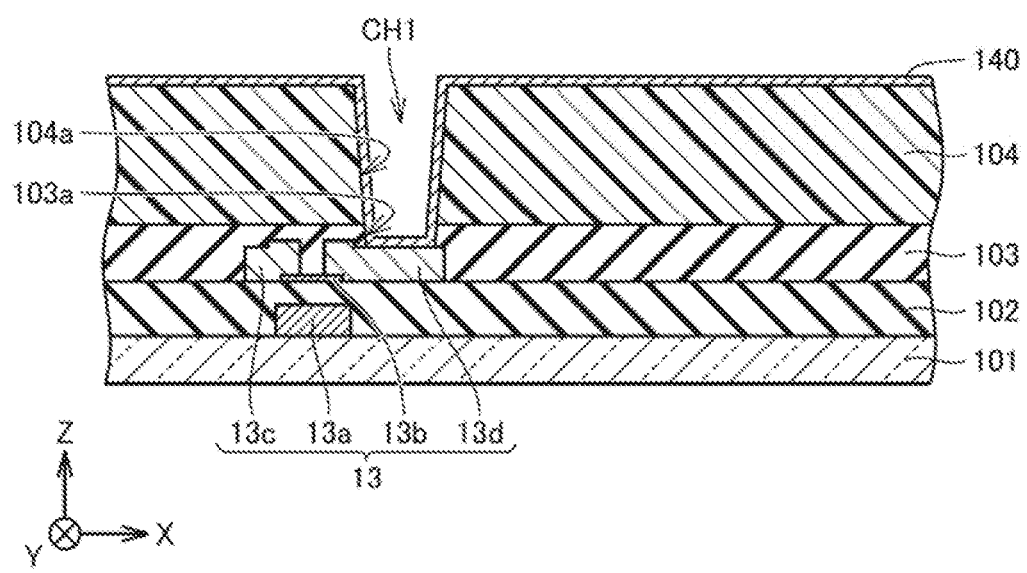
FIG. 5E is a cross-sectional view illustrating a step of forming a metal film as a lower electrode (a cathode electrode) illustrated in FIG. 4.
Figure 5F:
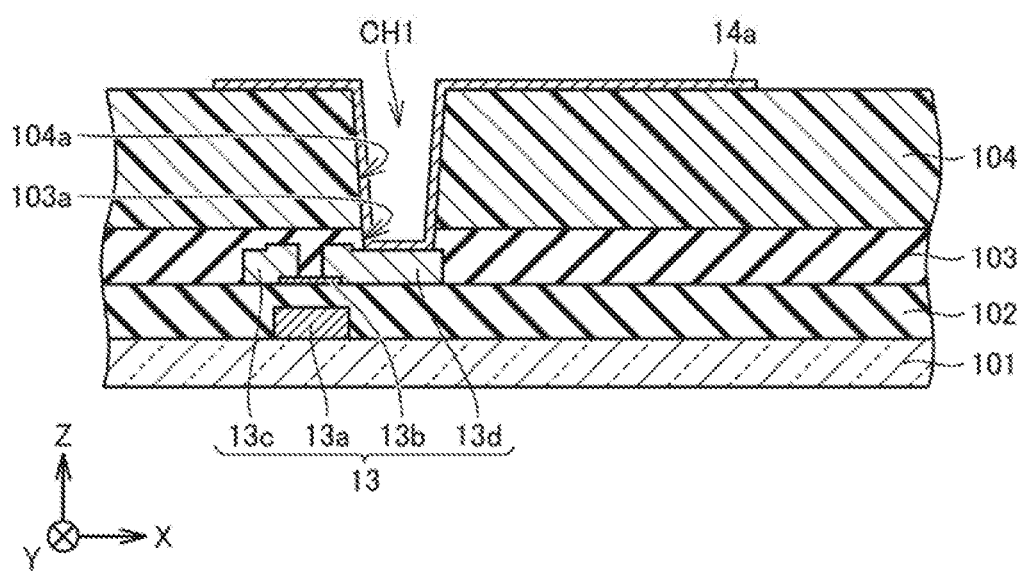
FIG. 5F is a cross-sectional view illustrating a step of patterning the metal film illustrated in FIG. 5E to form the lower electrode.

Next, a metal film 140 formed of molybdenum nitride (MoN) is formed by, for example, a sputtering method (see FIG. 5E), and then a photolithography method and wet etching are performed to pattern the metal film 140 (see FIG. 5F). As a result, the lower electrode 14a connected to the drain electrode 13d in the contact hole CH1 is formed.

Figure 5G:
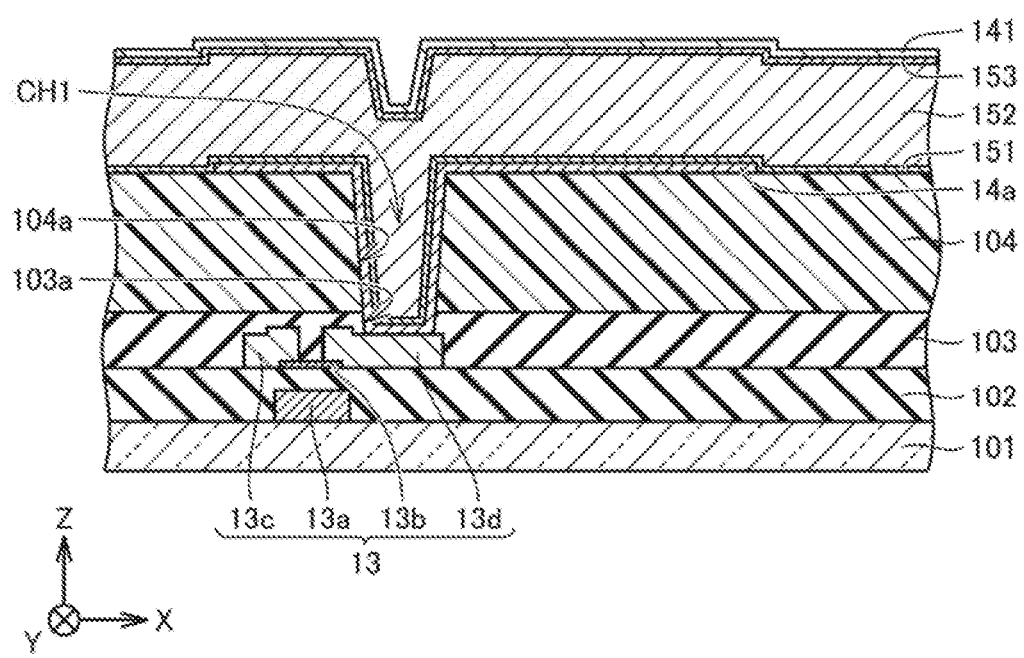
FIG. 5G is a cross-sectional view illustrating a step of forming a semiconductor layer as a photoelectric conversion layer illustrated in FIG. 4 and a transparent conductive film as an upper electrode (an anode electrode).

Thereafter, the n-type amorphous semiconductor layer 151, the intrinsic amorphous semiconductor layer 152, and the p-type amorphous semiconductor layer 153 are formed in this order using, for example, a plasma CVD method. Then, the transparent conductive film 141 formed of ITO is formed using a sputtering method (see FIG. 5G).

Figure 5H:
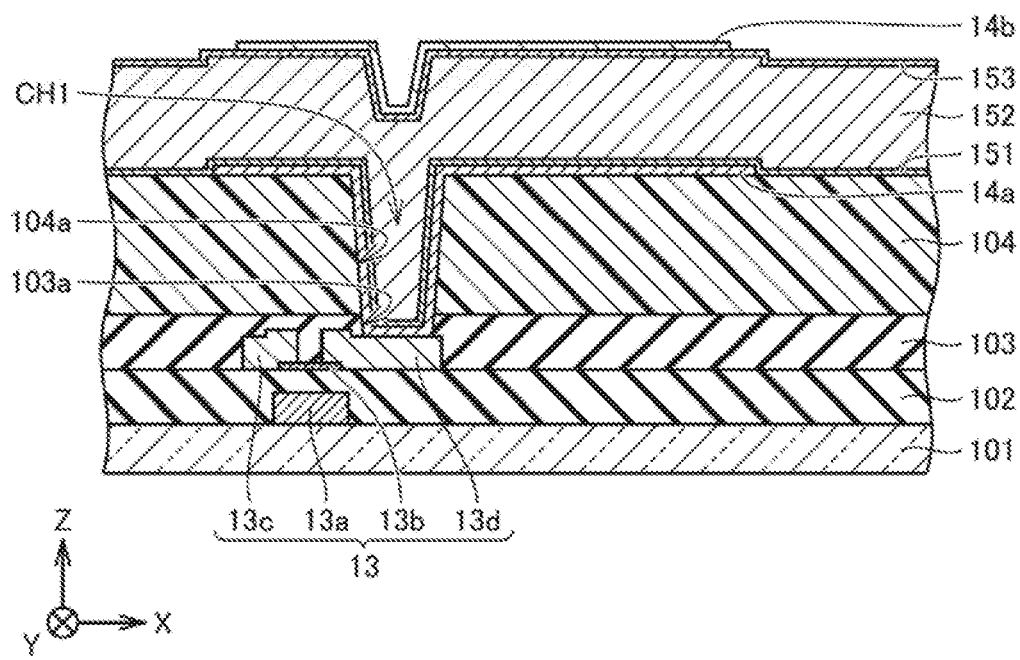
FIG. 5H is a cross-sectional view illustrating a step of patterning the transparent conductive film illustrated in FIG. 5G to form the upper electrode.

Next, a photolithography method and dry etching are performed to pattern the transparent conductive film 141 (see FIG. 5H). Accordingly, the upper electrode 14b is formed on the p-type amorphous semiconductor layer 153.

Figure 5I:
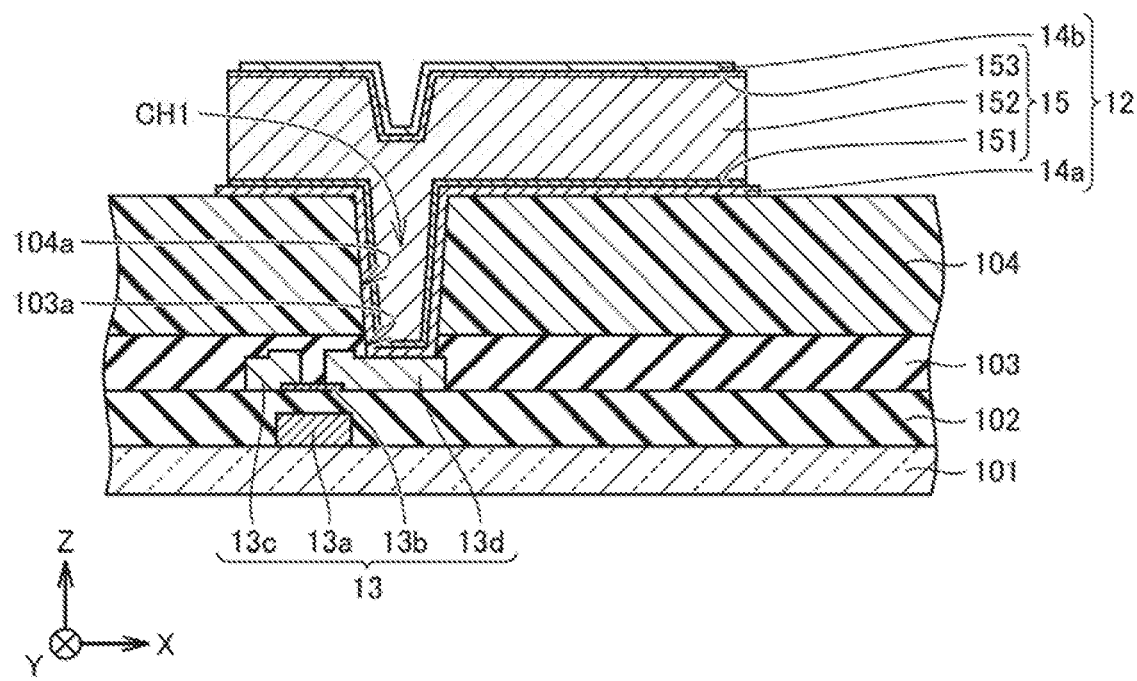
FIG. 5I is a cross-sectional view illustrating a step of patterning the semiconductor layer illustrated in FIG. 5G to form a photoelectric conversion layer.
Figure 5J:
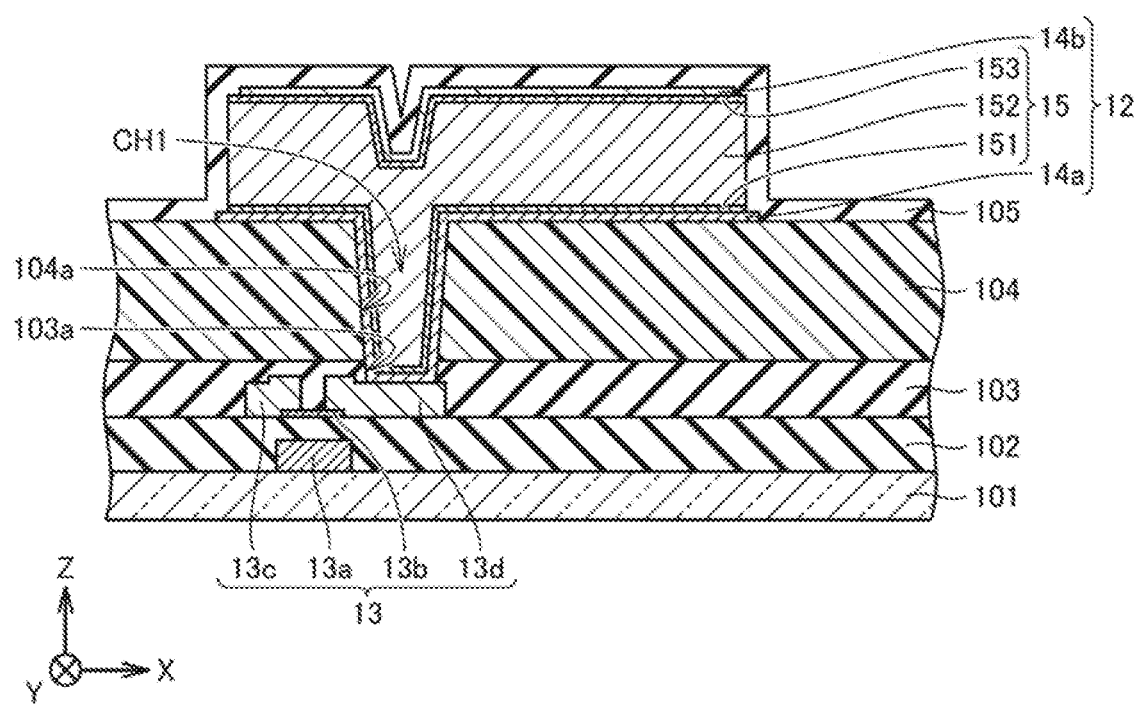
FIG. 5J is a cross-sectional view illustrating a step of forming a third insulating film illustrated in FIG. 4.

Next, a photolithography method and dry etching are performed to pattern the n-type amorphous semiconductor layer 151, the intrinsic amorphous semiconductor layer 152, and the p-type amorphous semiconductor layer 153 (see FIG. 5I). As a result, the photoelectric conversion layer 15 having a length in the X-axis direction that is less than that of the lower electrode 14a in a plan view and the length in the X-axis direction that is greater than that of the upper electrode 14b is formed, and the photodiode 12 including the lower electrode 14a, the photoelectric conversion layer 15, and the upper electrode 14b is formed.

Subsequently, the third insulating film 105 formed of silicon nitride (SiN) is formed on the second insulating film 104 to cover the surface of the photodiode 12 using, for example, a plasma CVD method (see FIG. 5J).

Figure 5K:
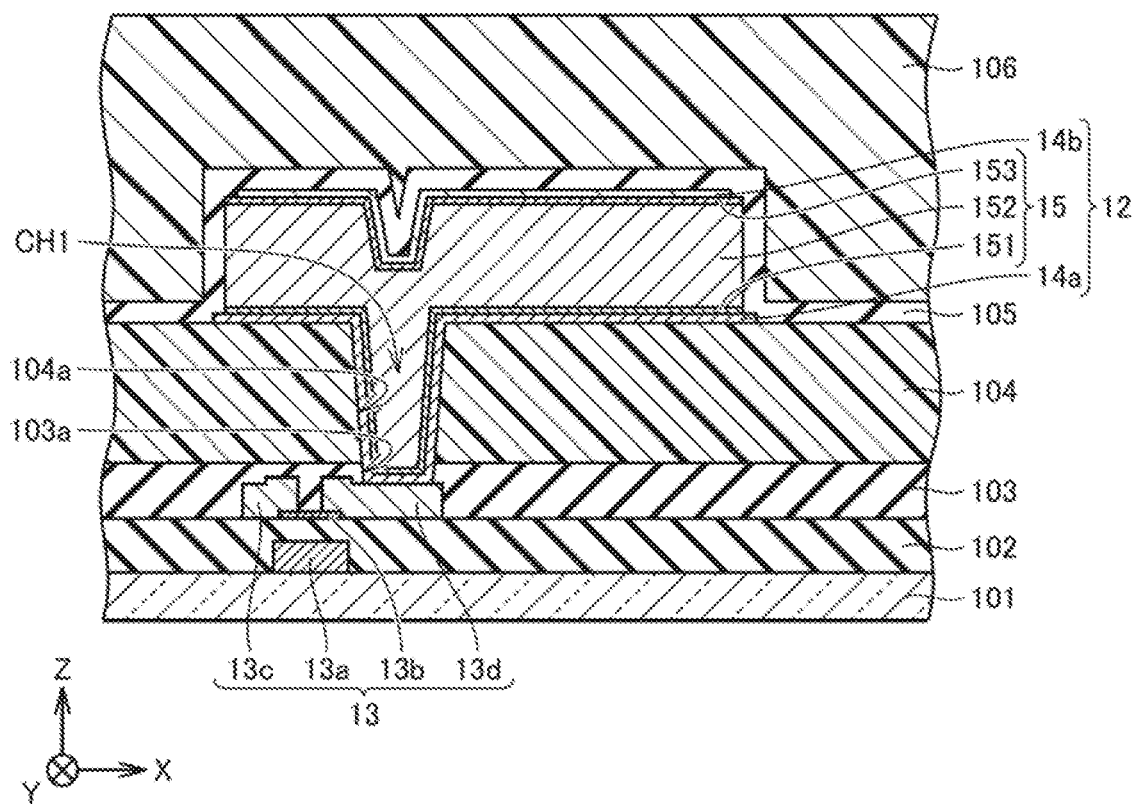
FIG. 5K is a cross-sectional view illustrating a step of forming a fourth insulating film illustrated in FIG. 4.
Figure 5L:
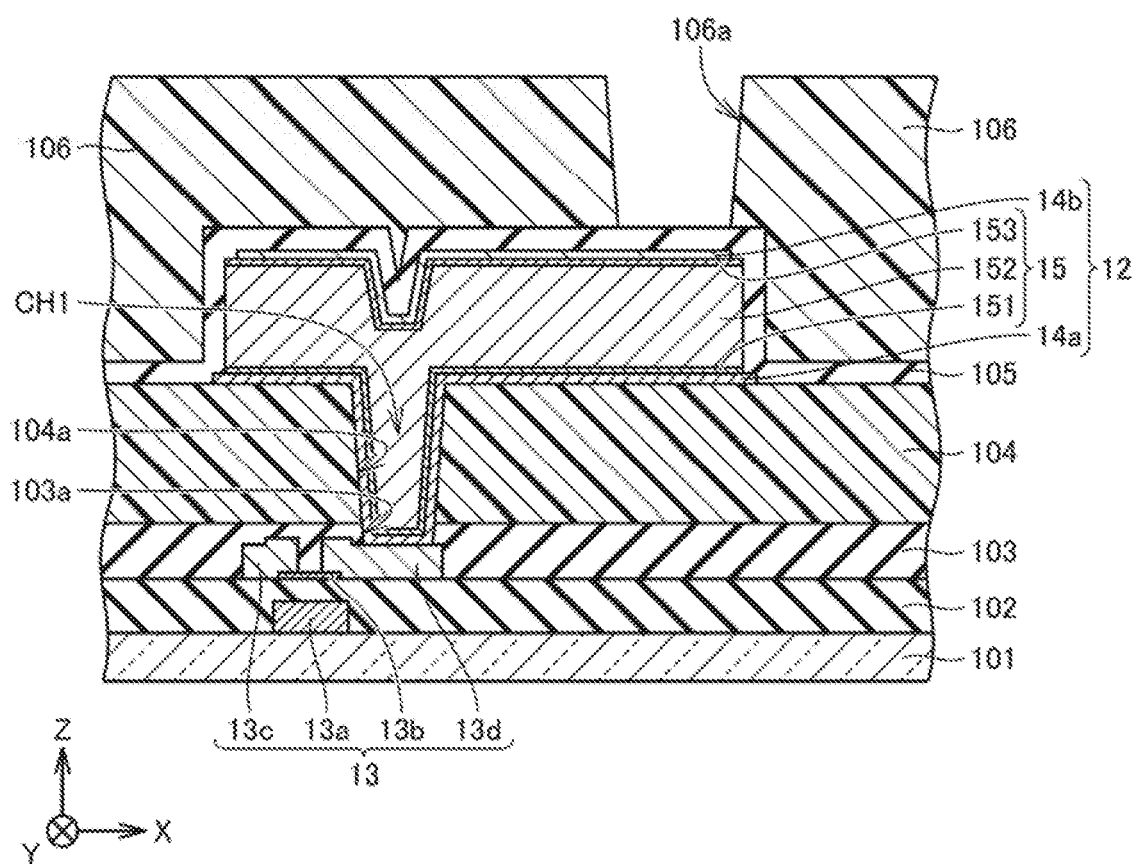
FIG. 5L is a cross-sectional view illustrating a step of patterning the fourth insulating film illustrated in FIG. 5K to form an opening.

Thereafter, the fourth insulating film 106 formed of an acrylic resin or a siloxane resin is formed by, for example, a slit coating method (see FIG. 5K), and the fourth insulating film 106 is patterned using a photolithography method (see FIG. 5L). As a result, the opening 106a of the fourth insulating film 106 is formed at a position overlapping the upper electrode 14b in a plan view.

Figure 5M:
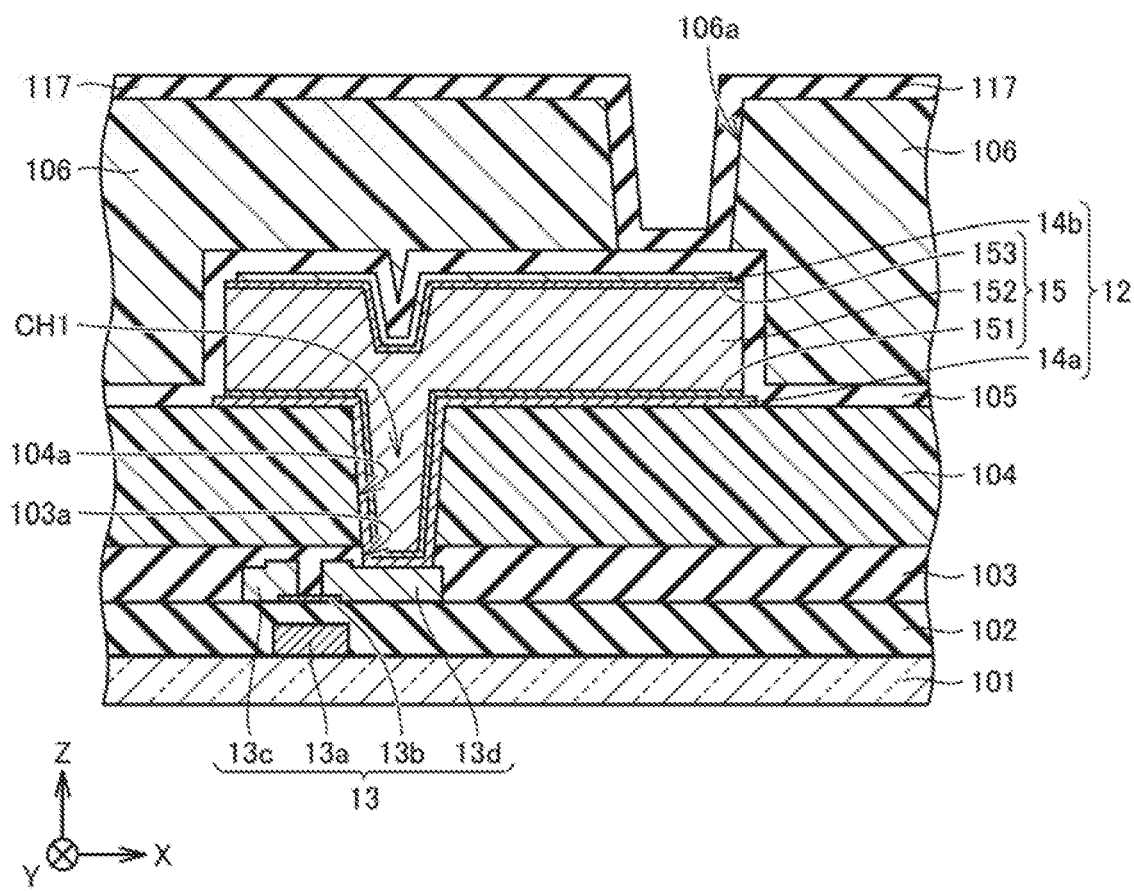
FIG. 5M is a cross-sectional view illustrating a step of forming a 5a-th insulating film illustrated in FIG. 4.
Figure 5N:
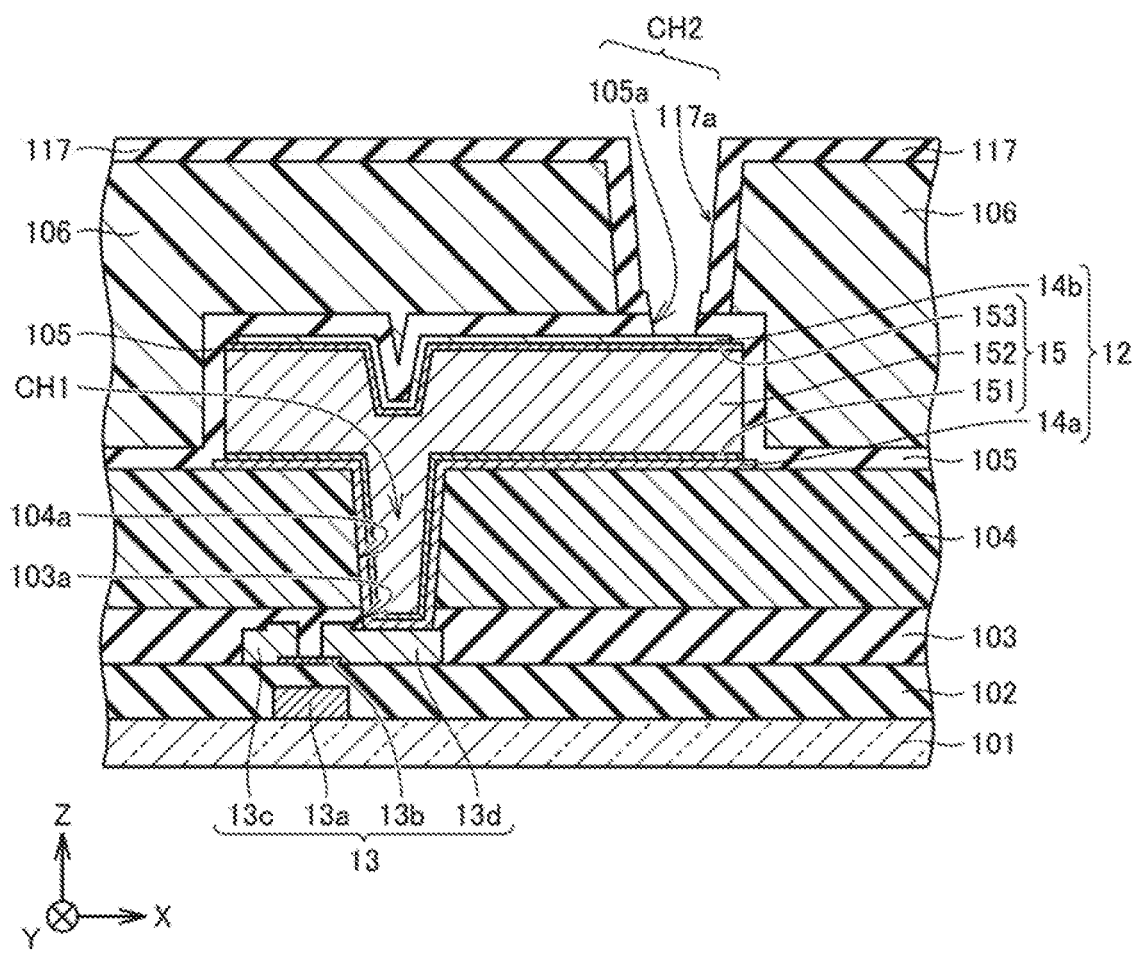
FIG. 5N is a cross-sectional view illustrating a step of patterning the 5a-th insulating film and the third insulating film illustrated in FIG. 5M to form a contact hole CH2.

Next, the 5a-th insulating film 117 formed of silicon nitride (SiN) is formed to cover the surface of the fourth insulating film 106 using, for example, a plasma CVD method (see FIG. 5M). Then, a photolithography method and dry etching are performed to pattern the 5a-th insulating film 117 and the third insulating film 105 (see FIG. 5N). As a result, the contact hole CH2 (openings 105a and 117a) extending through the third insulating film 105 and the 5a-th insulating film 117 is formed.

Figure 5O:
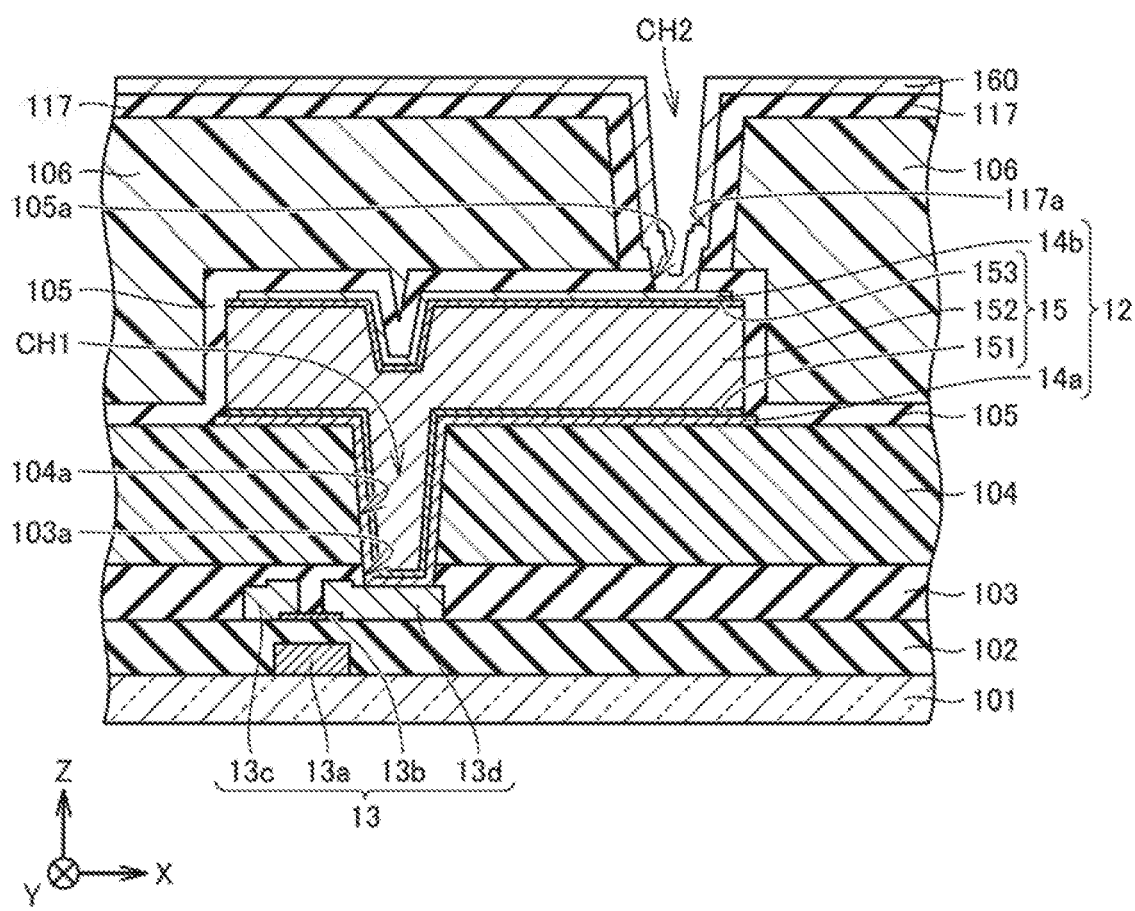
FIG. 5O is a cross-sectional view illustrating a step of forming a metal film as a bias wiring line illustrated in FIG. 4.
Figure 5P:
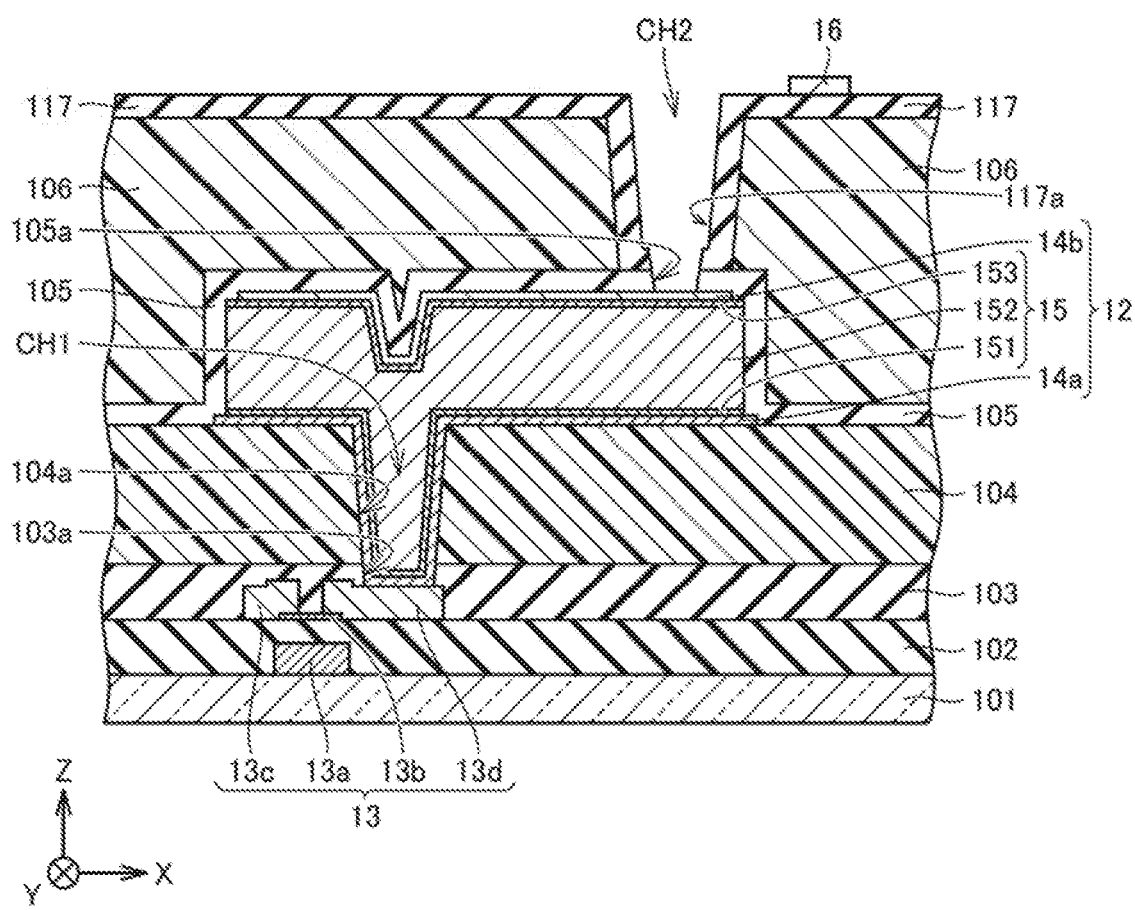
FIG. 5P is a cross-sectional view illustrating a step of patterning the metal film illustrated in FIG. 5O to form the bias wiring line.

Next, for example, a metal film 160 in which titanium (Ti), aluminum (Al), and molybdenum nitride (MoN) are sequentially layered is formed by a sputtering method to cover the surface of the 5a-th insulating film 117 (see FIG. 5O). Thereafter, a photolithography method and wet etching are performed to pattern the metal film 160 (see FIG. 5P). As a result, the bias wiring line 16 is formed on the 5a-th insulating film 117 at a position that does not overlap the photodiode 12 in a plan view.

Figure 5Q:
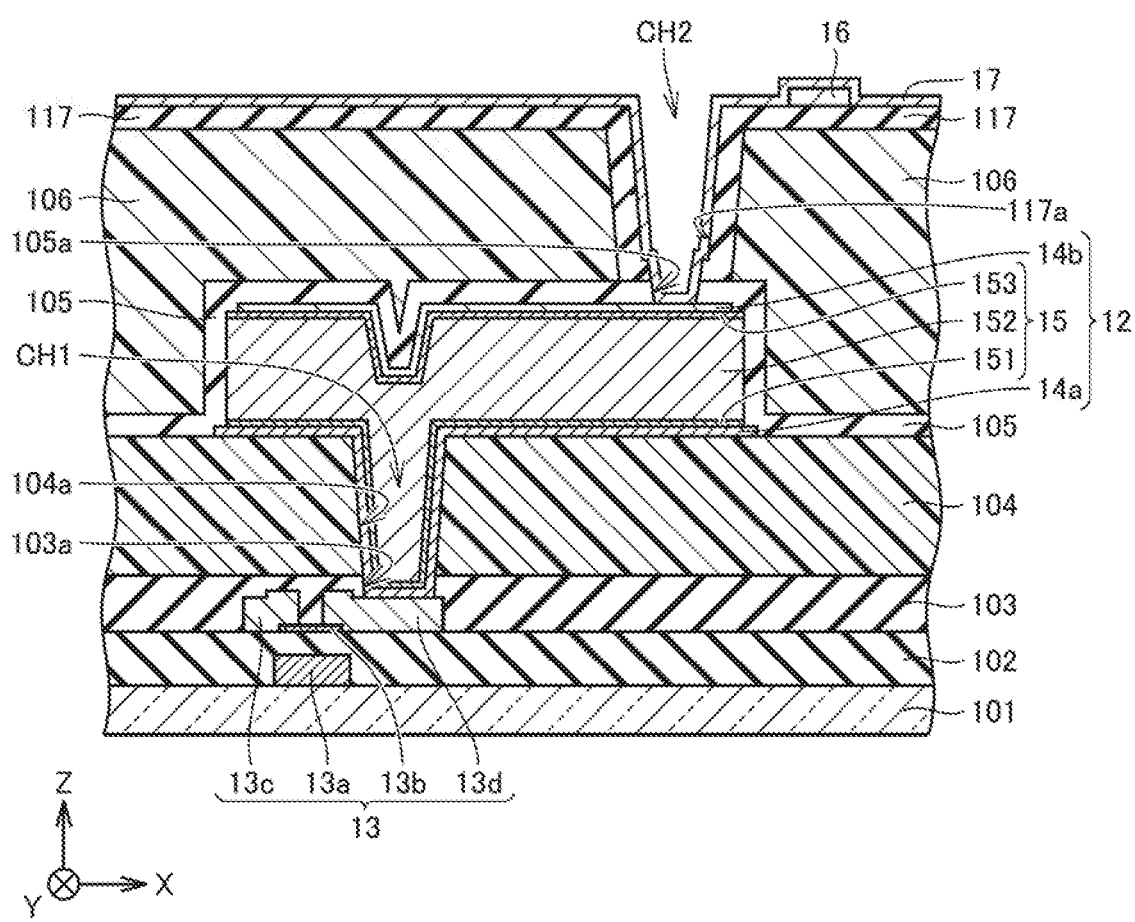
FIG. 5Q is a cross-sectional view illustrating a step of forming a transparent conductive film connected to the bias wiring line and the upper electrode illustrated in FIG. 4.
Figure 5R:
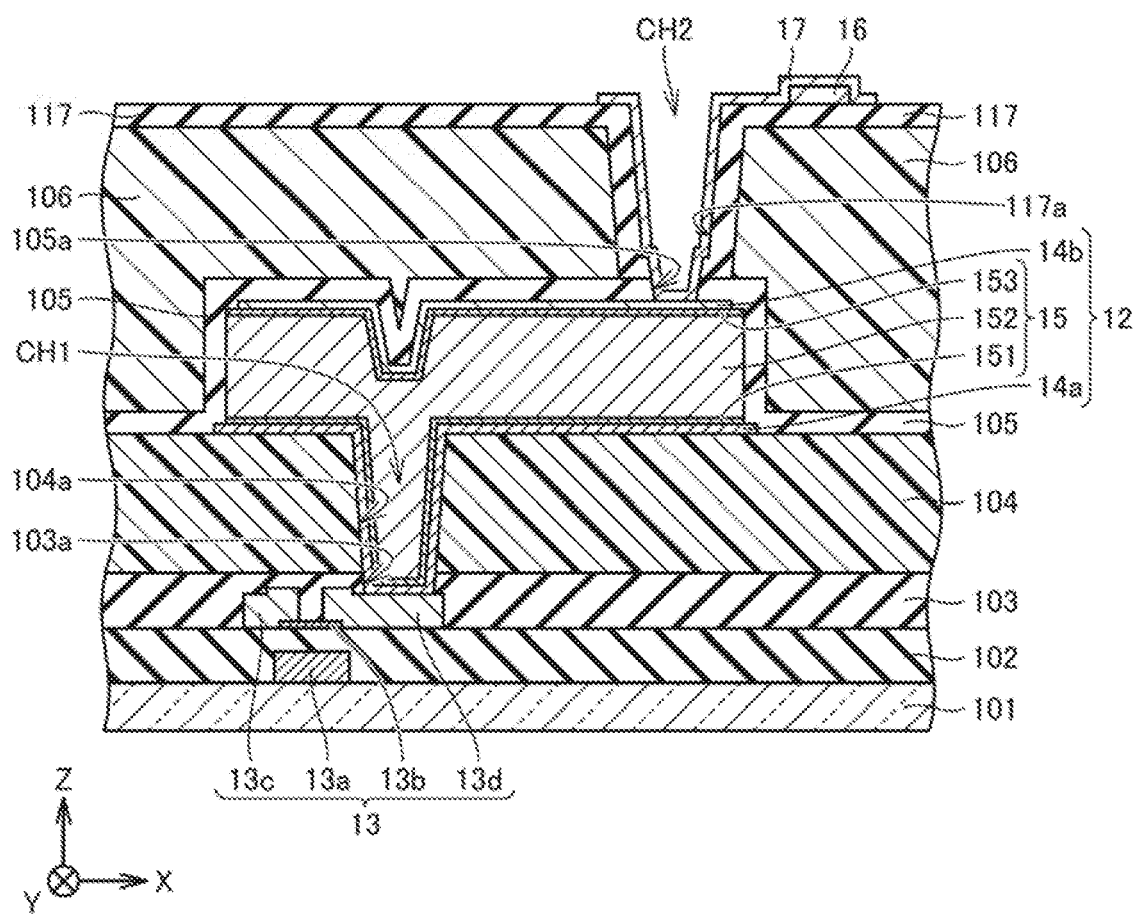
FIG. 5R is a cross-sectional view illustrating a step of patterning the transparent conductive film illustrated in FIG. 5Q.

Next, the transparent conductive film 17 formed of ITO is formed to cover the surfaces of the 5a-th insulating film 117 and the bias wiring line 16 by, for example, a sputtering method (see FIG. 5Q). Thereafter, a photolithography method and dry etching are performed to pattern the transparent conductive film 17 (see FIG. 5R). In this way, the transparent conductive film 17 covering the bias wiring line 16 and the surface of the 5a-th insulating film 117 inside the opening 117a and connected to the upper electrode 14b in the contact hole CH2 (the opening 105a) is formed.

Figure 5S:
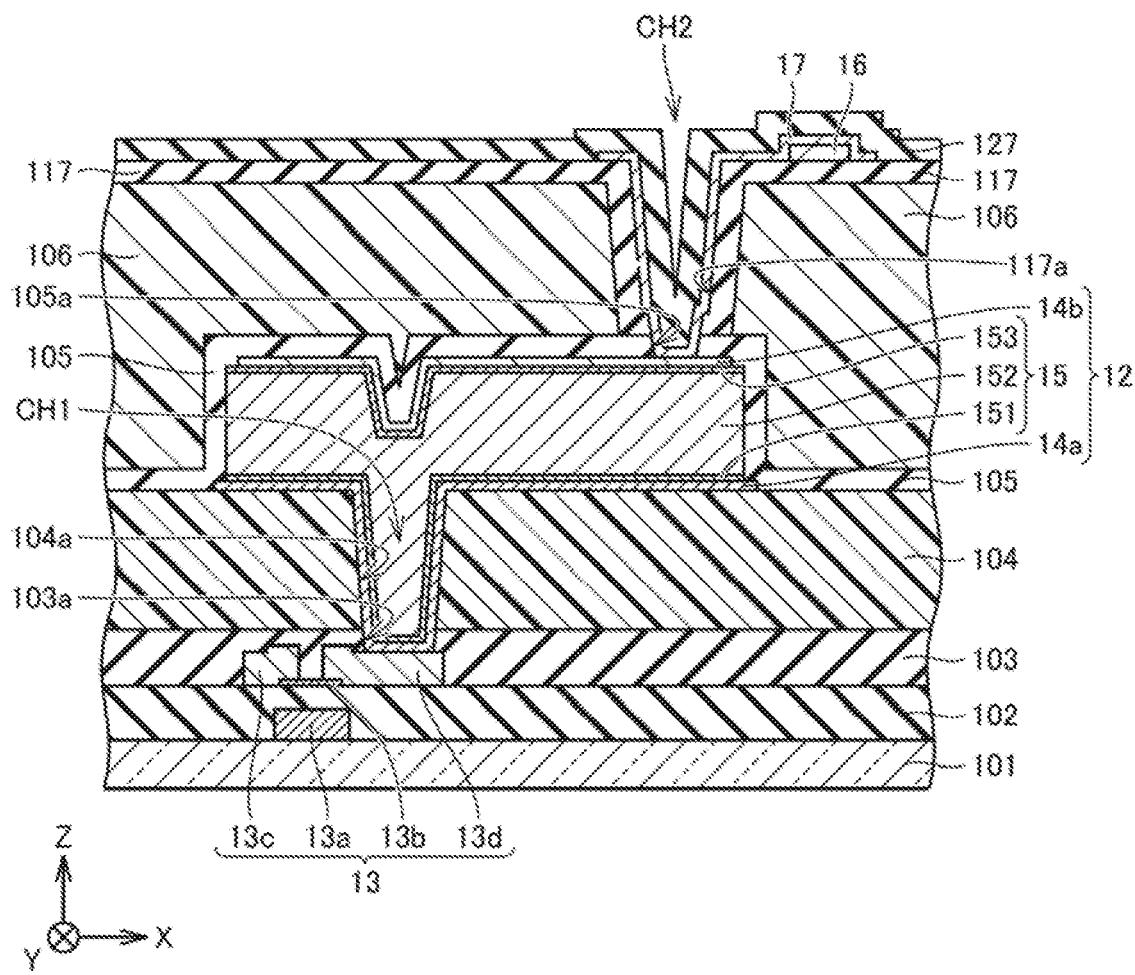
FIG. 5S is a cross-sectional view illustrating a step of forming a 5b-th insulating film illustrated in FIG. 4.
Figure 5T:
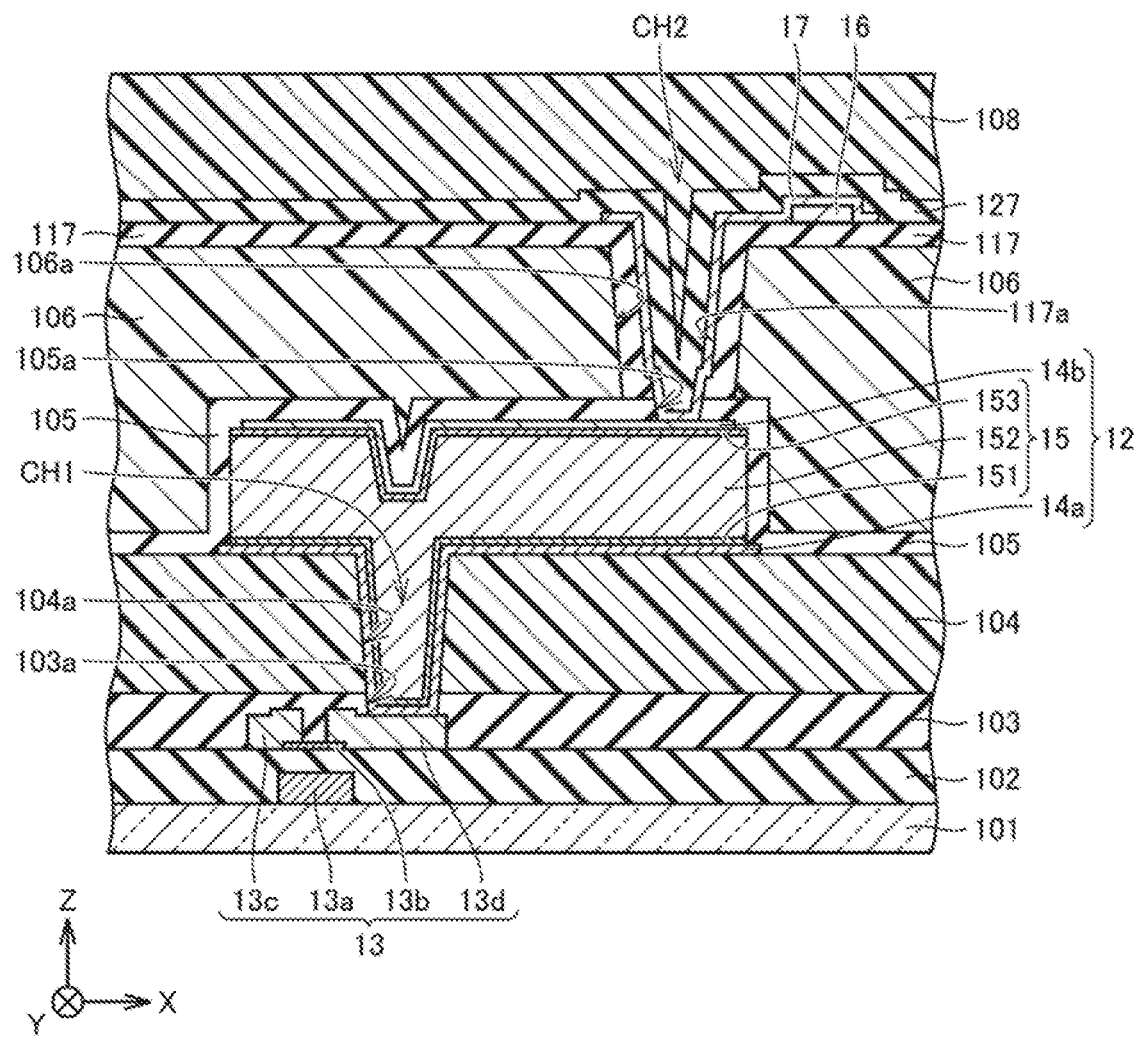
FIG. 5T is a cross-sectional view illustrating a step of forming a sixth insulating film illustrated in FIG. 4.

Next, the 5b-th insulating film 127 formed of silicon nitride (SiN) is formed to cover the surfaces of the 5a-th insulating film 117 and the transparent conductive film 17 using, for example, a plasma CVD method (see FIG. 5S).

Thereafter, the sixth insulating film 108 formed of the acrylic resin or the siloxane resin is formed to cover the 5b-th insulating film 127 by, for example, a slit coating method (see FIG. 5T). As a result, the active matrix substrate 1 according to the present embodiment is manufactured.

Operation of X-Ray Imaging Device 100

Here, the operation of the X-ray imaging device 100 illustrated in FIG. 1 will be described. First, X-rays are emitted from the X-ray source 3. At this time, the controller 2 applies a predetermined voltage (a bias voltage) to the bias wiring line 16 (see FIG. 3 and the like). The X-rays emitted from the X-ray source 3 pass through the subject S and enter the scintillator 4. The X-rays entering the scintillator 4 are converted into fluorescence (scintillation light), and the scintillation light enters the active matrix substrate 1. In a case that the scintillation light enters the photodiode 12 provided in each pixel P1 in the active matrix substrate 1, the photodiode 12 converts the scintillation light into an electric charge depending on an amount of the scintillation light. A signal corresponding to the electric charge converted by the photodiode 12 is read by the signal reading section 2B (see FIG. 2 and the like) via the source wiring line 10 in a case where the TFT 13 (see FIG. 3 and the like) is in the on state depending on a gate voltage (positive voltage) output from the gate control section 2A via the gate wiring line 11. Then, an X-ray image corresponding to the read signal is generated in the controller 2.

Application Example

In the step illustrated in FIG. 5N, while the contact hole CH2 is formed by simultaneously etching the 5a-th insulating film 117 and the third insulating film 105 in the first embodiment described above, the method of forming the contact hole CH2 is not limited thereto.

Figure 6A:
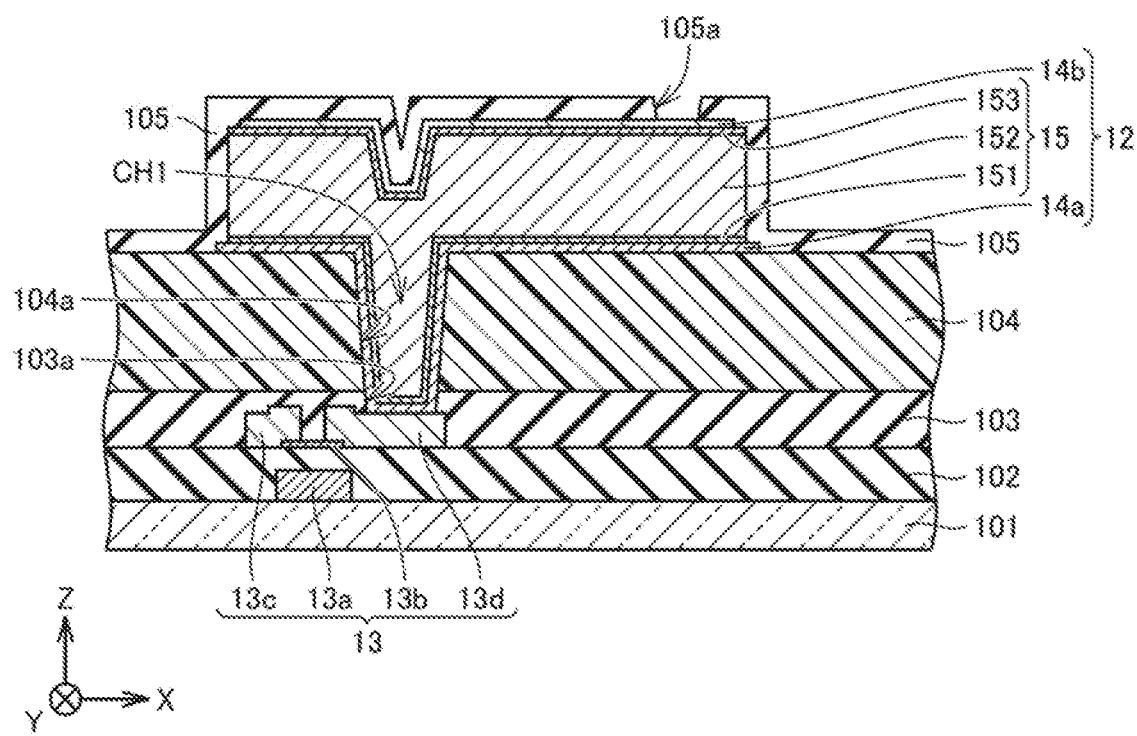
FIG. 6A is a cross-sectional view illustrating a manufacturing method different from that of the first embodiment and is a cross-sectional view illustrating a step of forming an opening of the third insulating film.

For example, after the steps illustrated in FIG. 5A to 5J are performed, a photolithography method and dry etching are performed to pattern the third insulating film 105, and thus the opening 105a of the third insulating film 105 is formed (see FIG. 6A).

Figure 6B:
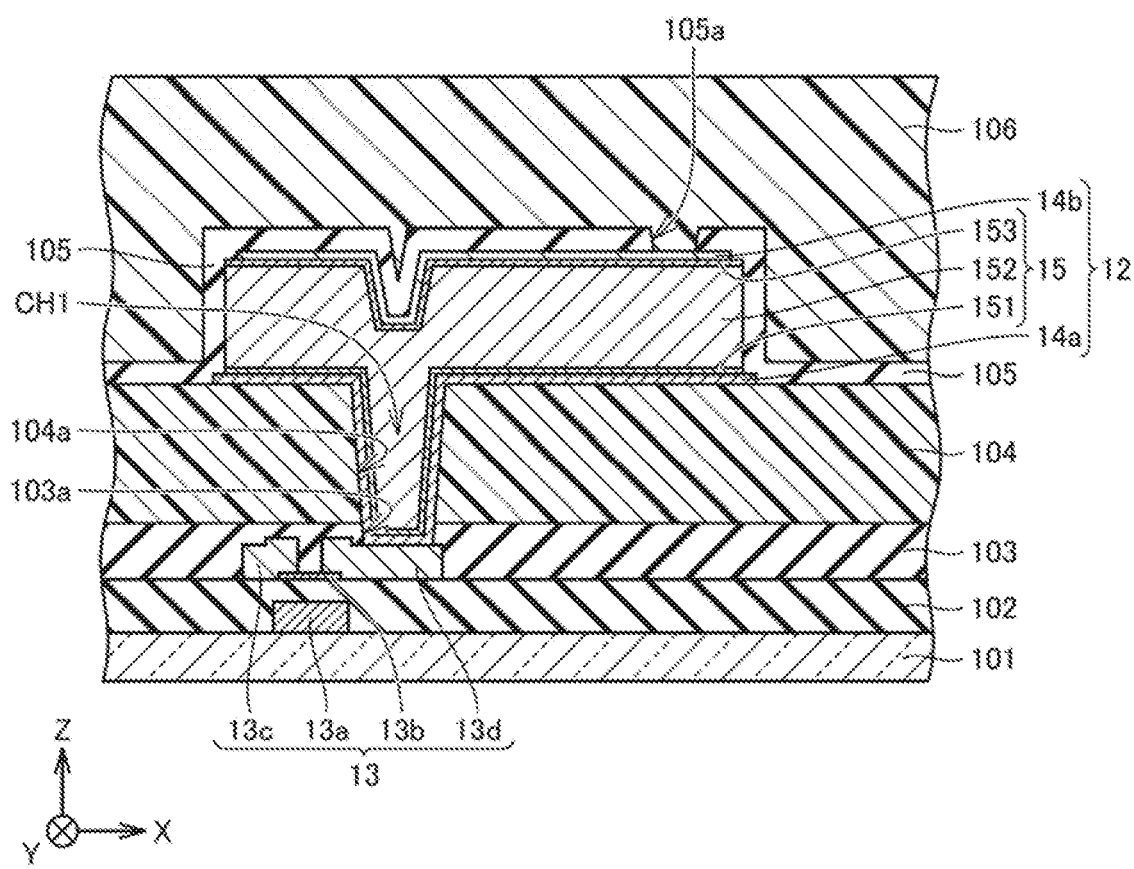
FIG. 6B is a cross-sectional view illustrating a step of forming the fourth insulating film illustrated in FIG. 4 after the step of FIG. 6A.
Figure 6C:
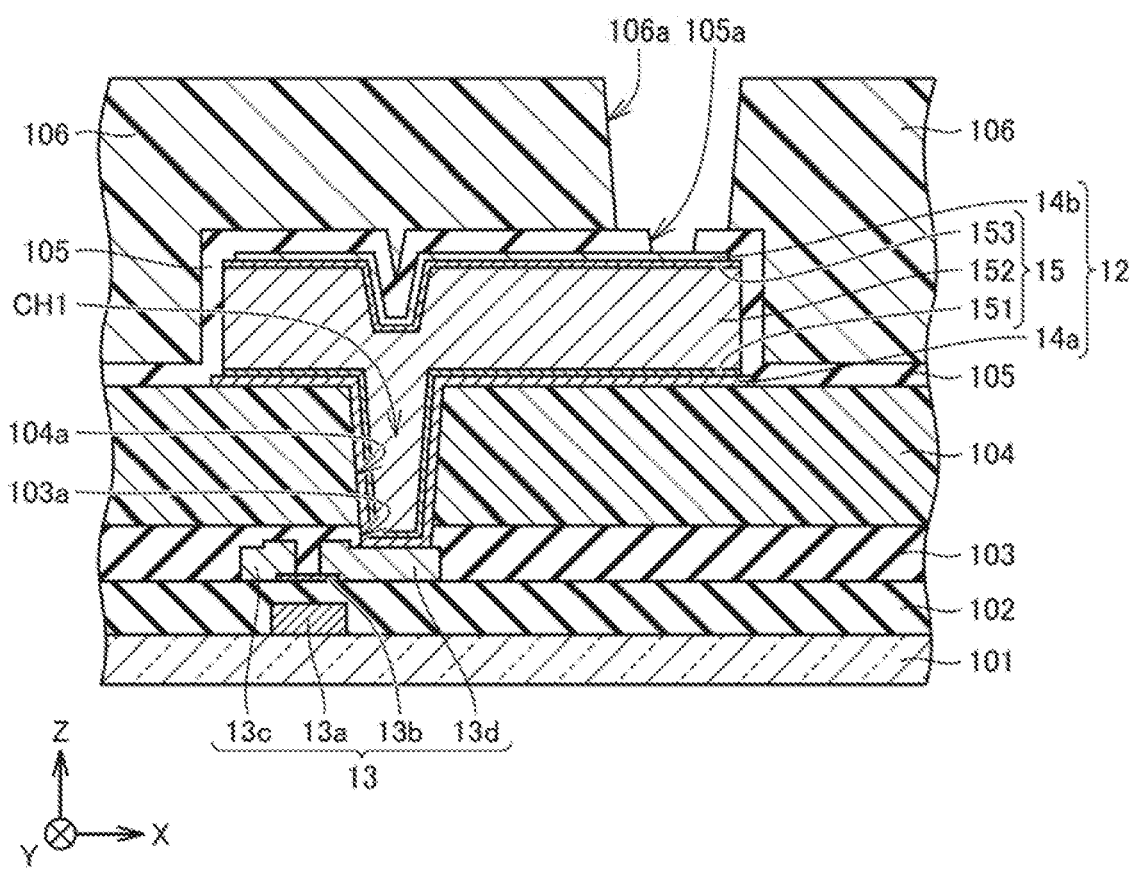
FIG. 6C is a cross-sectional view illustrating a step of forming an opening of the fourth insulating film illustrated in FIG. 6B.

Thereafter, the step in FIG. 5K described above is performed, the fourth insulating film 106 is formed on the third insulating film 105 (see FIG. 6B), and the opening 106a of the fourth insulating film 106 is formed at a position overlapping the opening 105a in a plan view (see FIG. 6C) by performing the step in FIG. 5L described above.

Figure 6D:
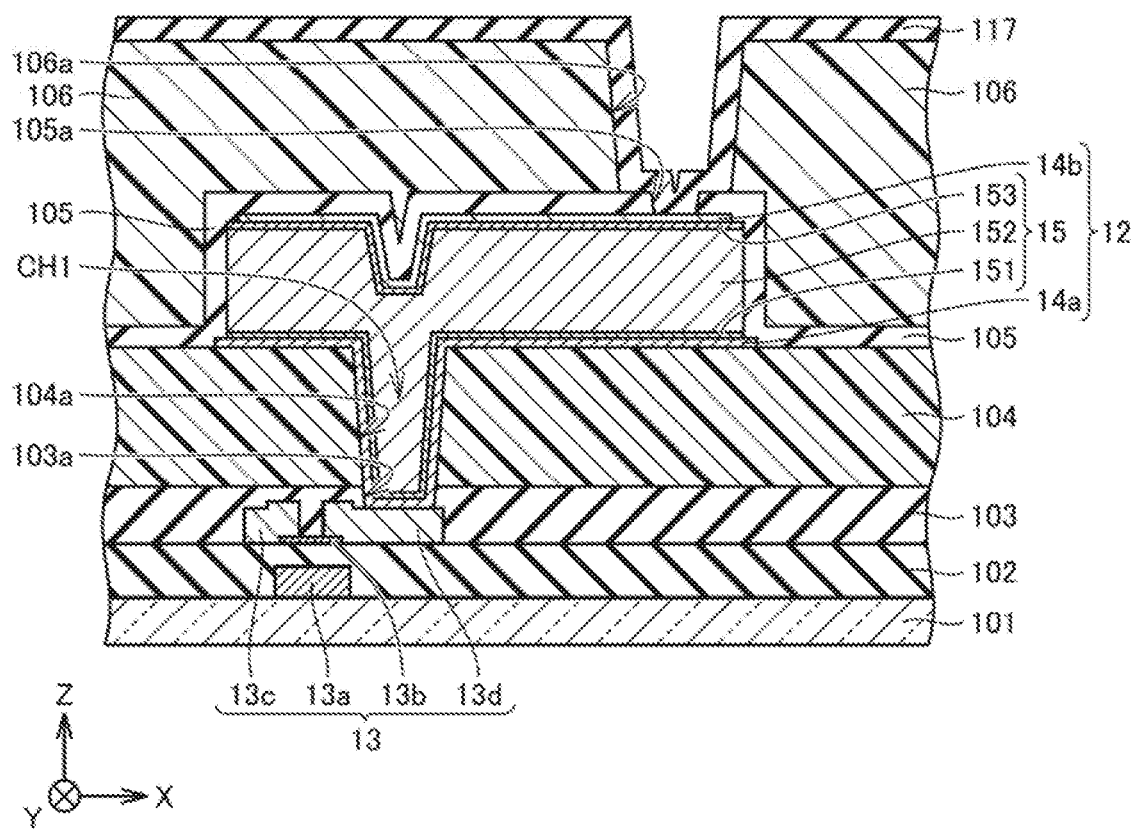
FIG. 6D is a cross-sectional view illustrating a step of forming the 5a-th insulating film illustrated in FIG. 4.

Then, by performing the step in FIG. 5M described above, the 5a-th insulating film 117 covering the surfaces of the fourth insulating film 106 and the third insulating film 105 is formed (see FIG. 6D).

Figure 6E:
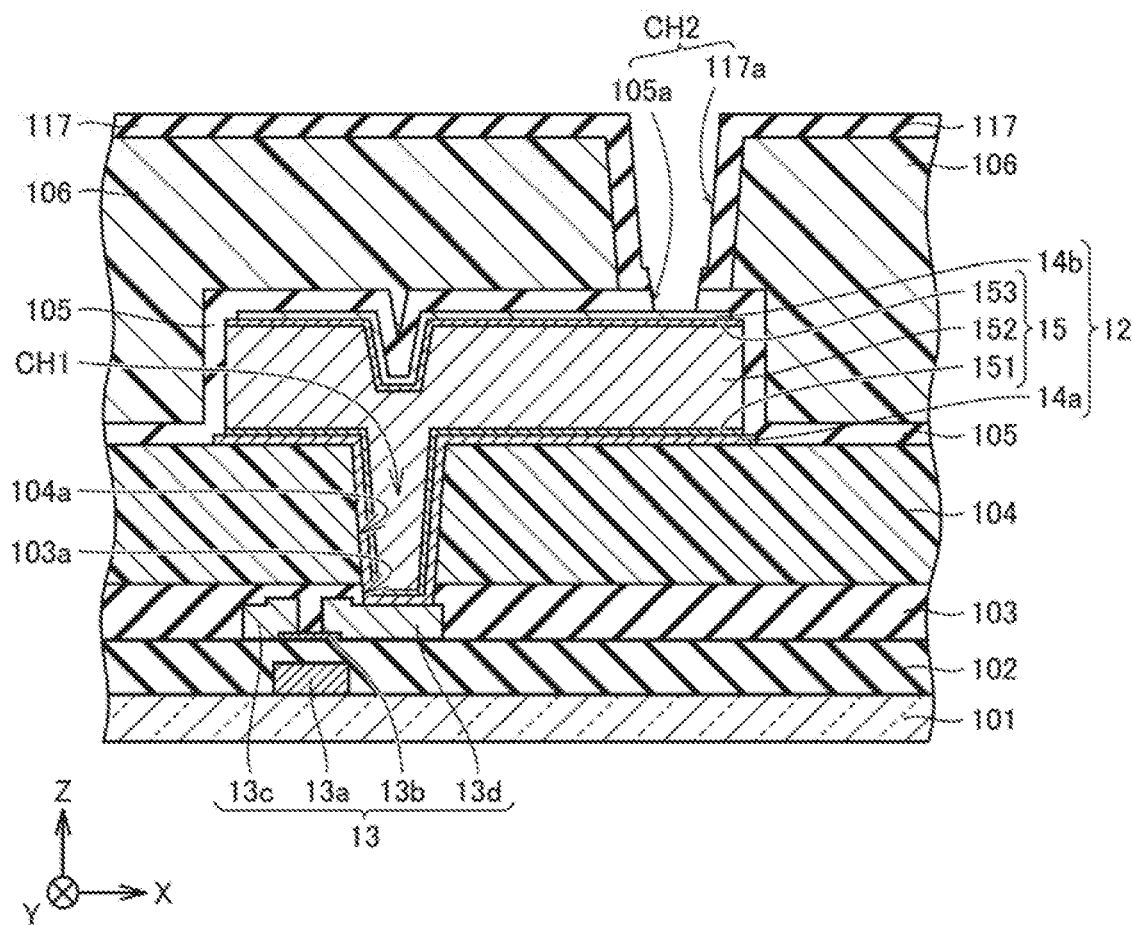
FIG. 6E is a cross-sectional view illustrating a step of patterning the 5a-th insulating film and the third insulating film illustrated in FIG. 6D to form the contact hole CH2.

Next, a photolithography method and dry etching are performed to pattern the 5a-th insulating film 117, and thus the opening 117a of the 5a-th insulating film 117 is formed at a position overlapping the opening 105a of the third insulating film 105 in a plan view (see FIG. 6E). As a result, the contact hole CH2 constituted by the opening 105a and the opening 117a is formed.

Thereafter, the active matrix substrate 1 (see FIG. 4) is formed by performing the steps in FIGS. 5O to 5T described above.

Second Embodiment

Figure 7:
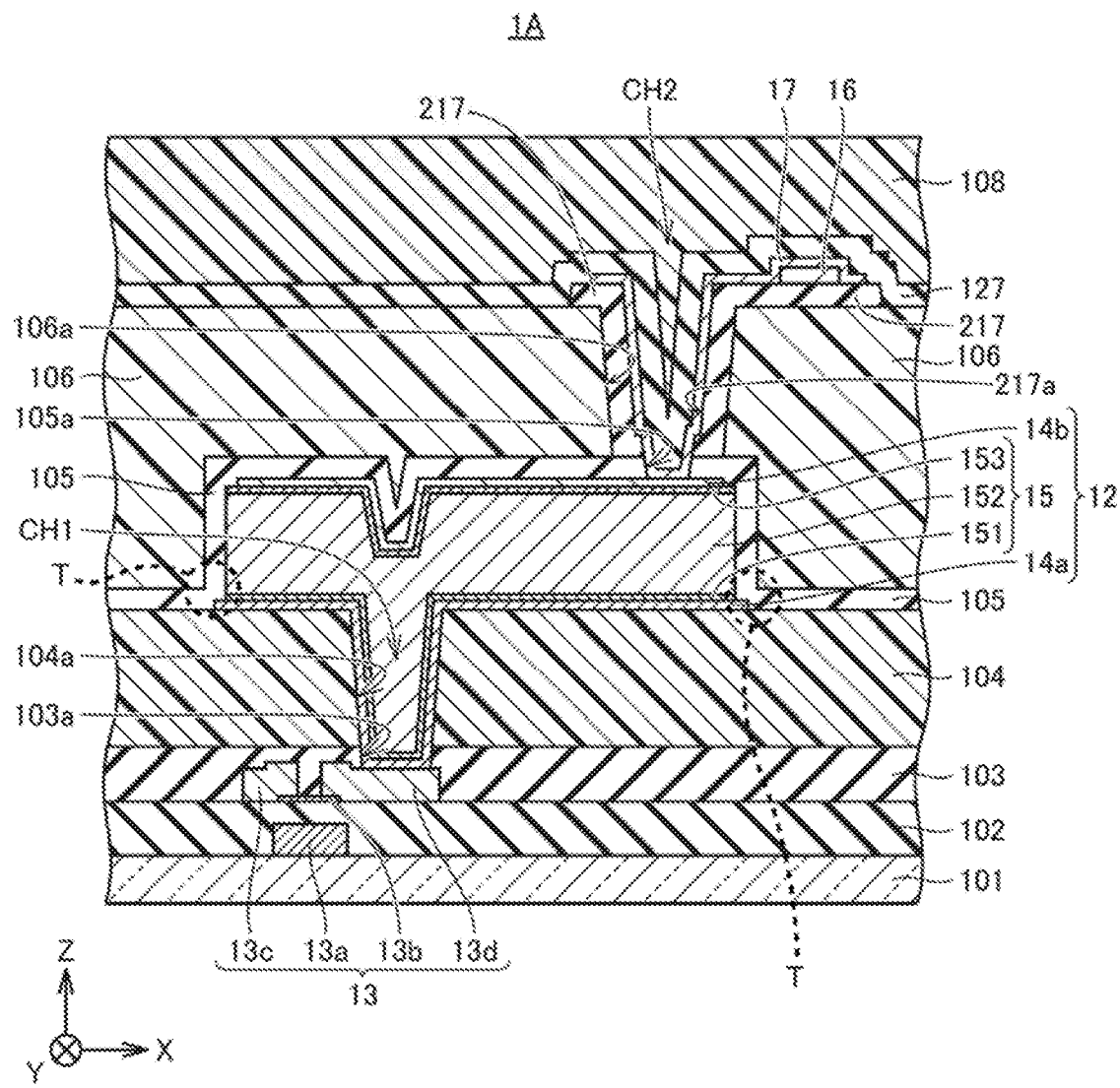
FIG. 7 is a schematic cross-sectional view of a pixel of an active matrix substrate according to a second embodiment.

FIG. 7 is a schematic cross-sectional view of a pixel of an active matrix substrate according to the present embodiment. In FIG. 7, the same reference signs as those of the first embodiment are given to configurations that are the same as in the first embodiment. Hereinafter, configurations different from those of the first embodiment will be mainly described.

As illustrated in FIG. 7, an active matrix substrate 1A in the present embodiment has the same configuration as that of the first embodiment except for a 5a-th insulating film 217.

The 5a-th insulating film 217 is formed of the same material as that of the 5a-th insulating film 117 of the first embodiment and has a film thickness equivalent to that of the 5a-th insulating film 117.

While the 5a-th insulating film 117 illustrated in FIG. 4 is disposed to be continuous with adjacent pixels outside the contact hole CH2, the 5a-th insulating film 217 in the present embodiment is disposed to be discontinuous with adjacent pixels outside the contact hole CH2. That is, in the present embodiment, except for a portion of the opening 105a, the 5a-th insulating film 217 is provided between the transparent conductive film 17 and the fourth insulating film 106, and the entirety of the photodiode 12 at a position outside the contact hole CH2 is not covered with the 5a-th insulating film 127.

With such a configuration, similar to the first embodiment, since the transparent conductive film 17 is not in direct contact with the fourth insulating film 106, even in a case where moisture permeates the fourth insulating film 106, a leakage current is less likely to flow between the upper electrode 14b and the lower electrode 14a via the transparent conductive film 17. Further, compared to the first embodiment in which the 5a-th insulating film 117 and the 5b-th insulating film 127 are formed to be continuous with adjacent pixels, the incident efficiency of the scintillation light on the photoelectric conversion layer 15 can be improved, and the sensor sensitivity can be improved.

The active matrix substrate 1A in the present embodiment can be manufactured by a method described below.

Figure 8A:
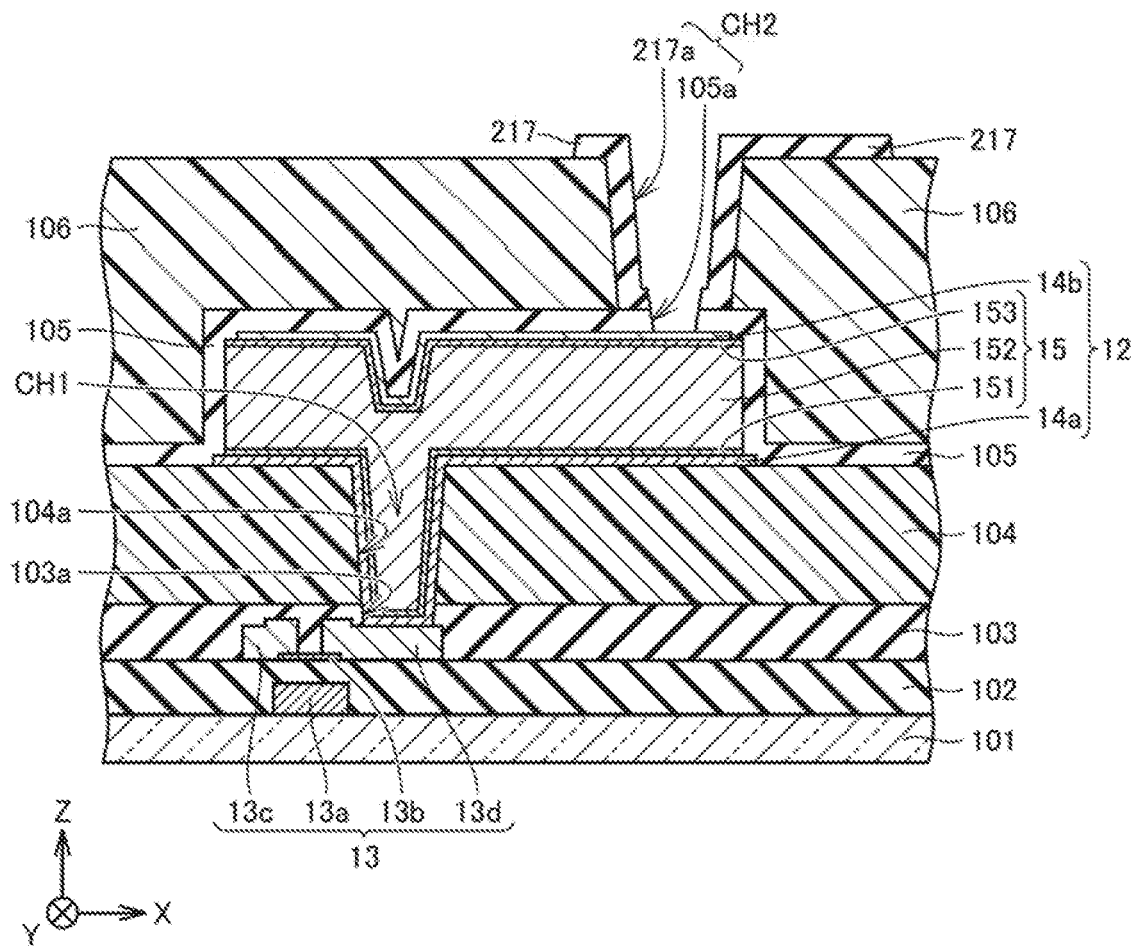
FIG. 8A is a cross-sectional view illustrating a step of manufacturing the active matrix substrate illustrated in FIG. 7 and is a cross-sectional view illustrating a step of patterning the 5a-th insulating film and the third insulating film illustrated in FIG. 5M.

First, after performing the same steps as in FIGS. 5A to 5M of the first embodiment described above, a photolithography method and dry etching are performed to pattern the 5a-th insulating film 117 and the third insulating film 105. As a result, the 5a-th insulating film 217 and the contact hole CH2 constituted by the opening 217a of the 5a-th insulating film 217 and the opening 105a of the third insulating film 105 are formed (see FIG. 8A).

Figure 8B:
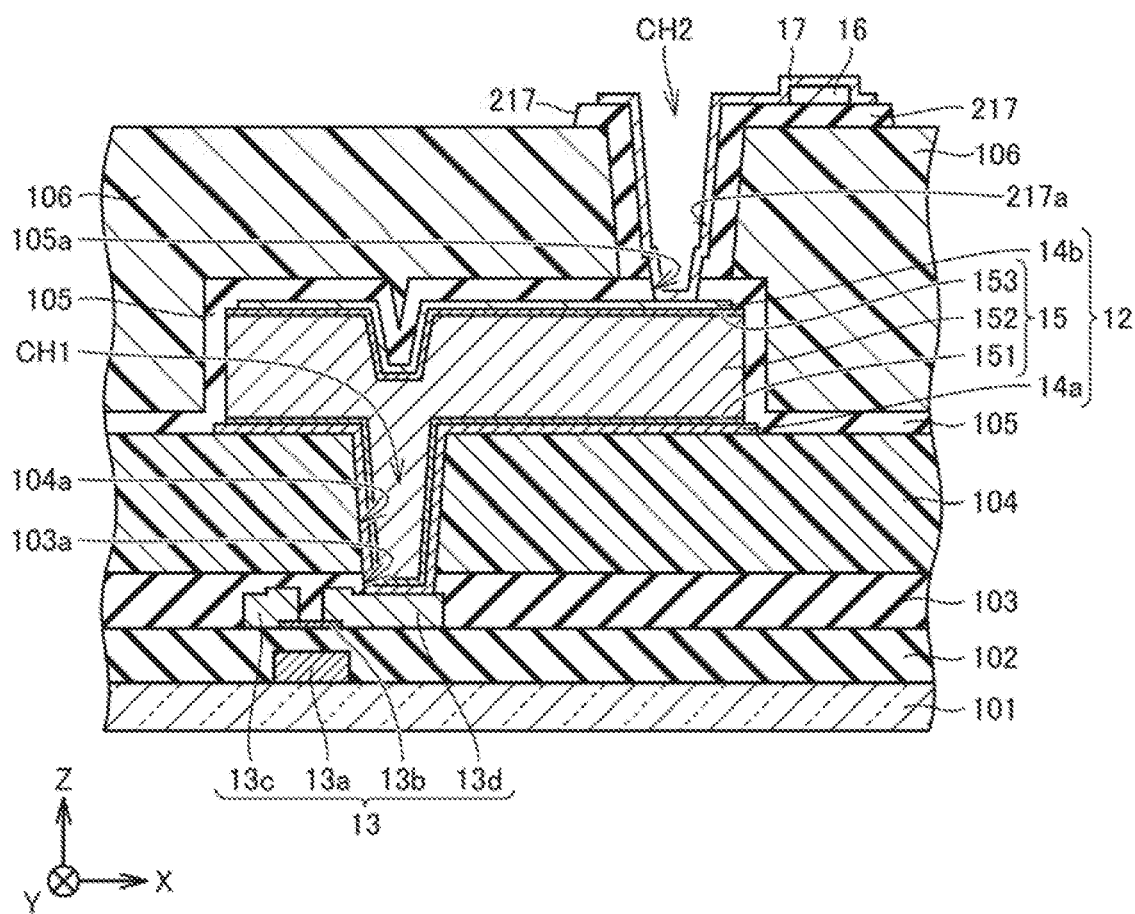
FIG. 8B is a cross-sectional view illustrating a step of forming a transparent conductive film illustrated in FIG. 7.

Thereafter, by performing the steps of FIGS. 5O to 5Q described above, the transparent conductive film 17 connected to the upper electrode 14b in the contact hole CH2 is formed on the 5a-th insulating film 217 (see FIG. 8B).

Figure 8C:
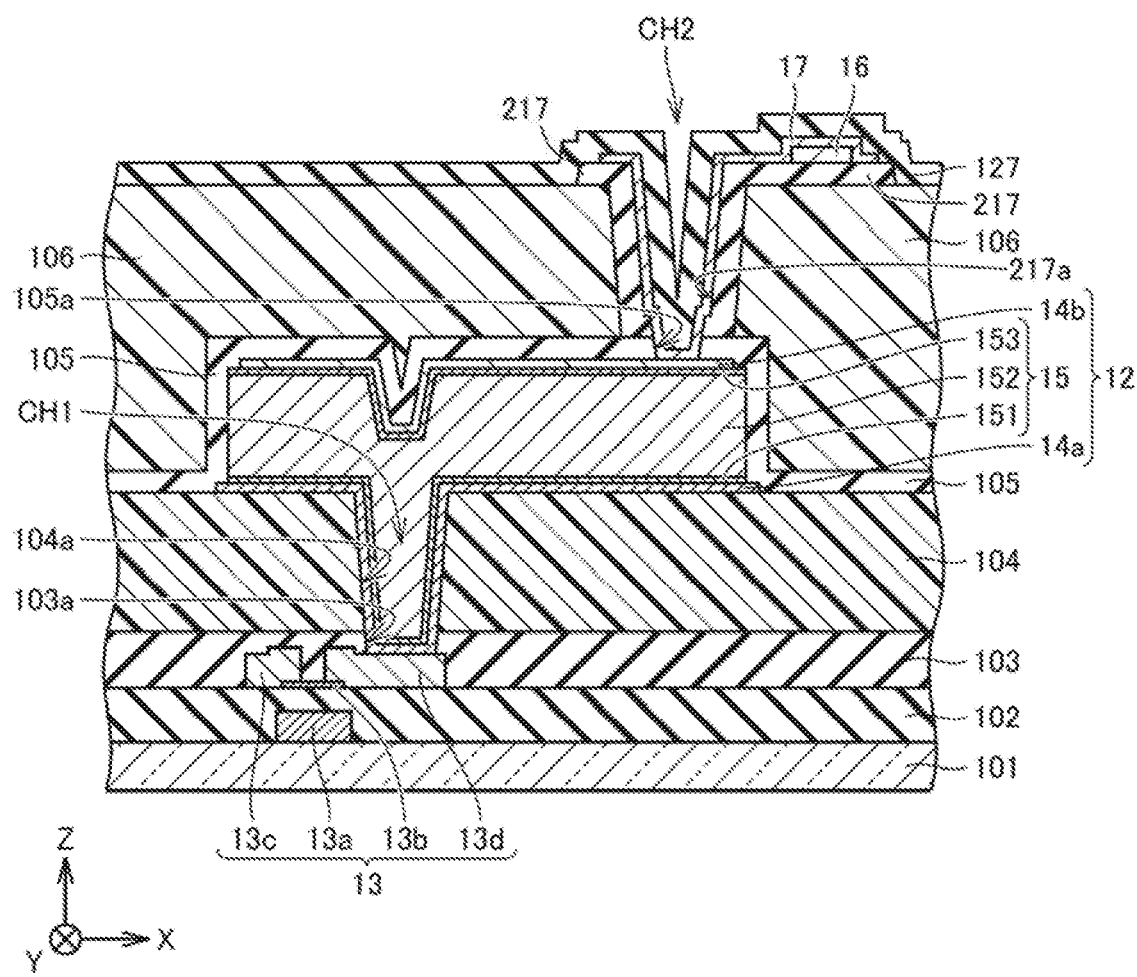
FIG. 8C is a cross-sectional view illustrating a step of forming the 5b-th insulating film illustrated in FIG. 7.

Then, by performing the step of FIG. 5S described above, the 5b-th insulating film 127 covering the fourth insulating film 106 and the transparent conductive film 17 is formed (see FIG. 8C). Thereafter, the step in FIG. 5T described above is performed to form the active matrix substrate 1A in the present embodiment.

Application Example

While the example in which the 5a-th insulating film 217 is formed to be discontinuous with adjacent pixels outside the contact hole CH2 is described above in the second embodiment, the configuration described below may also be possible.

Figure 9:
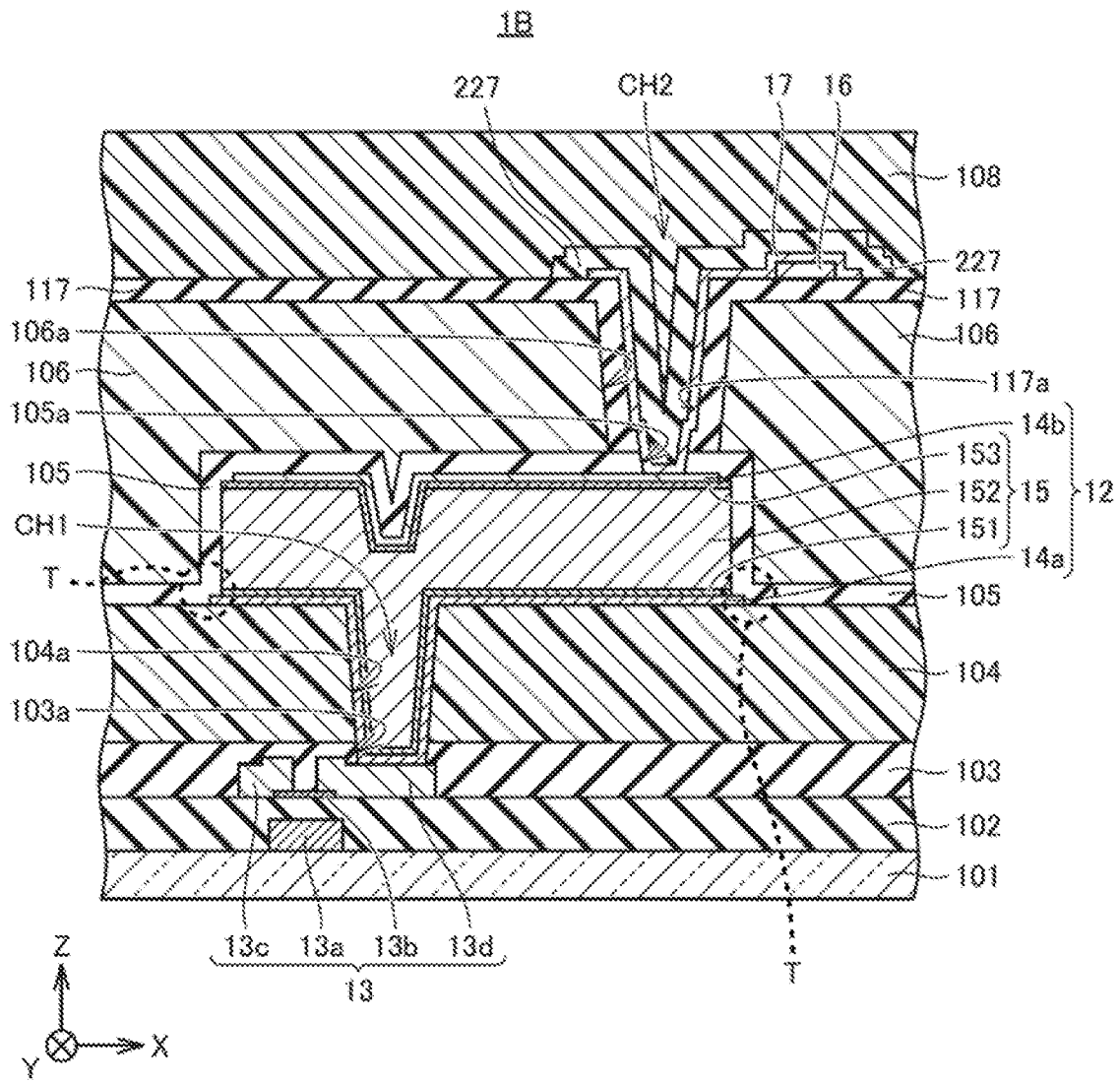
FIG. 9 is a schematic cross-sectional view of a pixel of an active matrix substrate according to an application example of the second embodiment.

FIG. 9 is a schematic cross-sectional view of a pixel in an active matrix substrate of the present application example. In FIG. 9, components that are the same as those of the first and second embodiments described above are denoted by the same reference signs as in those embodiments.

As illustrated in FIG. 9, an active matrix substrate 1B of the present application example includes the same 5a-th insulating film 117 as in the first embodiment and a 5b-th insulating film 227 instead of the 5b-th insulating film 127. The 5b-th insulating film 227 is formed of the same material as that of the 5b-th insulating film 127 and has a film thickness equivalent to that of the 5b-th insulating film 127.

While the 5b-th insulating film 127 described above is disposed to cover the transparent conductive film 17 and overlap the entirety of the photodiode 12 in a plan view, the 5b-th insulating film 227 covers the transparent conductive film 17 and overlaps a part of the photodiode 12 in a plan view.

With such a configuration, compared to the first embodiment in which both the 5a-th insulating film 117 and the 5b-th insulating film 127 are formed to be continuous with adjacent pixels, the incident efficiency of the scintillation light on the photoelectric conversion layer 15 can be improved, and the sensor sensitivity can be improved. In addition, even in such a configuration, the transparent conductive film 17 is covered with the 5b-th insulating film 227. For this reason, even in a case where a part of the 5a-th insulating film 117 has scratches and the moisture that permeates into the fourth insulating film 106 penetrates the sixth insulating film 108 through the scratches of the 5a-th insulating film 117, a leakage current does not flow between the upper electrode 14b and the lower electrode 14a via the transparent conductive film 17.

Figure 10:
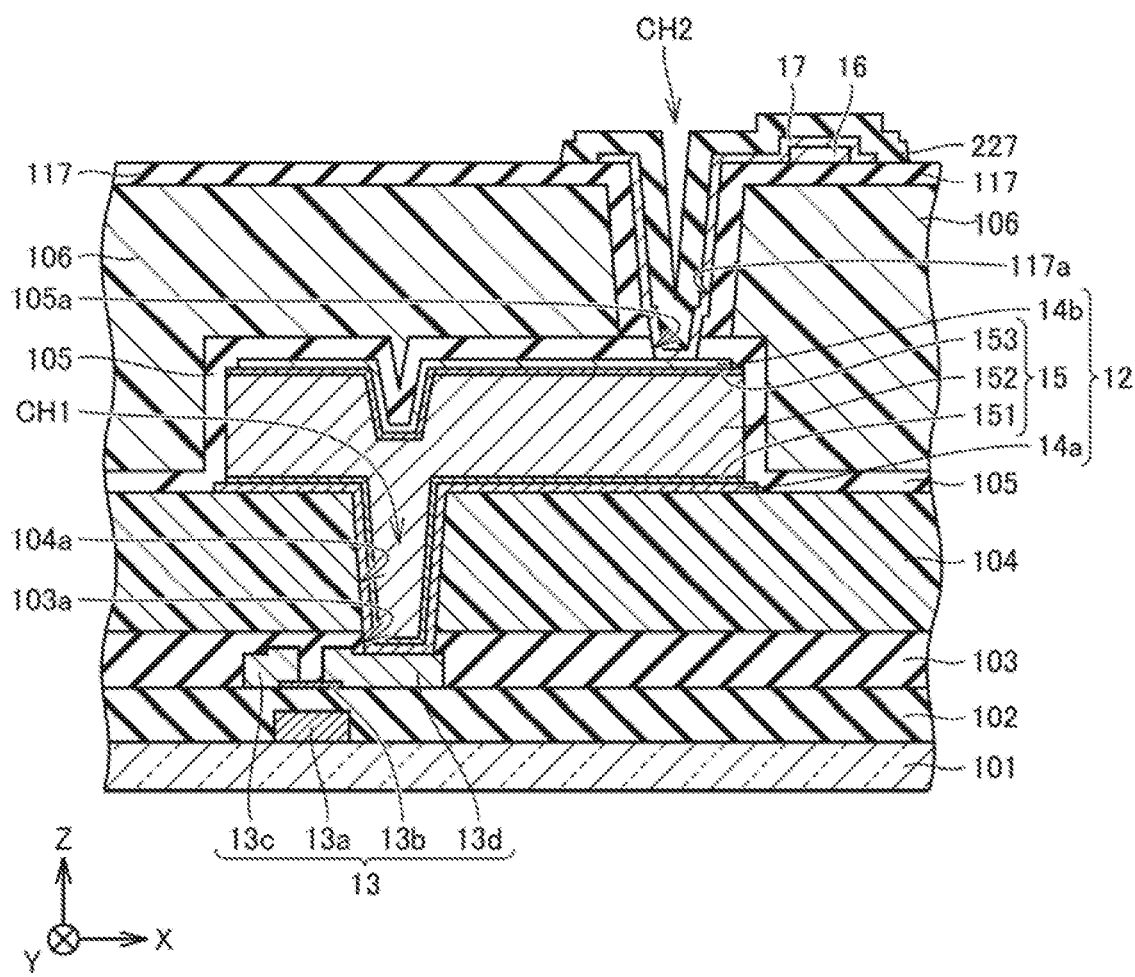
FIG. 10 is a cross-sectional view illustrating a step of manufacturing the active matrix substrate illustrated in FIG. 9 and is a cross-sectional view illustrating a step of patterning the 5b-th insulating film illustrated in FIG. 5S.

In this case, for example, after the 5b-th insulating film 127 is formed by performing the steps illustrated in FIGS. 5A to 5S described above, a photolithography method and dry etching are performed to pattern the 5b-th insulating film 127 (see FIG. 10). As a result, the 5b-th insulating film 227 is formed. Then, the active matrix substrate 1B (FIG. 9) is formed by performing the step in FIG. 5T described above.

Note that in the second embodiment and the application example thereof described above, similar to the application example of the first embodiment described above, the step in FIG. 6A may be performed after the step in FIG. 5J, and then the steps subsequent to FIG. 5K may be performed.

Third Embodiment

In the second embodiment described above, the example in which one of the 5a-th insulating film and the 5b-th insulating film is formed to be continuous with adjacent pixels at least outside the contact hole CH2, and the other is formed to be discontinuous with adjacent pixels is described. In the present embodiment, a configuration in which both the 5a-th insulating film and the 5b-th insulating film are formed to be discontinuous with adjacent pixels at least outside the contact hole CH2 will be described.

Figure 11:
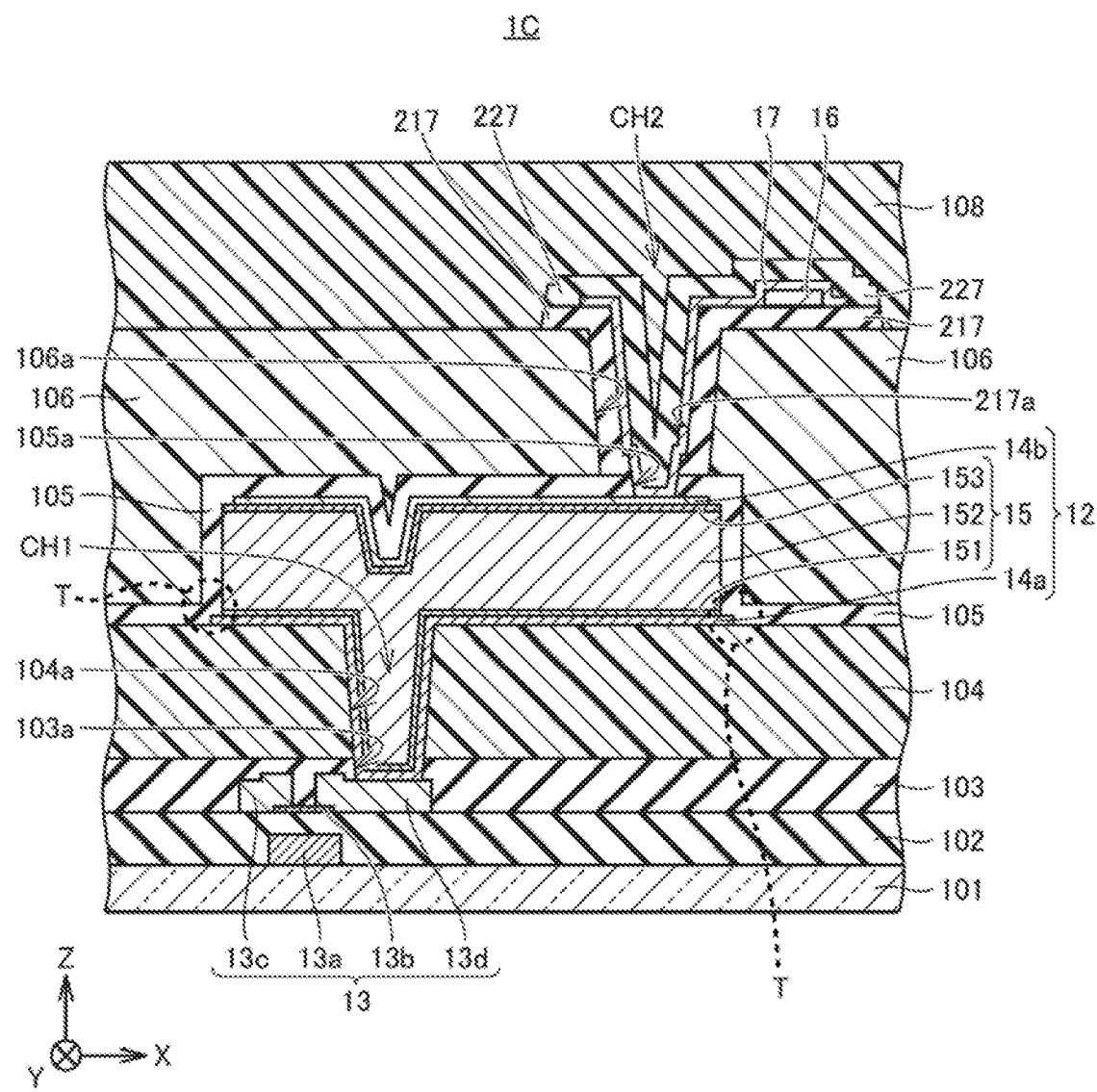
FIG. 11 is a schematic cross-sectional view of a pixel of an active matrix substrate according to a third embodiment.

FIG. 11 is a schematic cross-sectional view of a pixel of an active matrix substrate according to the present embodiment. In FIG. 11, components that are the same as those of the second embodiment described above have the same reference signs as those of the second embodiment.

As illustrated in FIG. 11, an active matrix substrate IC in the present embodiment includes the 5a-th insulating film 217 and the 5b-th insulating film 227.

As described in the above-mentioned second embodiment, the 5a-th insulating film 217 covers the surface of the fourth insulating film 106 inside the opening 106a and is formed to be discontinuous with adjacent pixels outside the contact hole CH2. In addition, as described in the application example of the above-mentioned second embodiment, the 5b-th insulating film 227 is provided on the 5a-th insulating film 217 to cover the transparent conductive film 17 and is formed to be discontinuous with adjacent pixels.

With such a configuration, the transparent conductive film 17 is not in direct contact with the fourth insulating film 106 and the sixth insulating film 108. For this reason, even in a case where the surface of the third insulating film 105 and the discontinuous portion (the dashed line frame T) of the third insulating film 105 are exposed to moisture, a leakage current does not flow between the upper electrode 14b and the lower electrode 14a via the transparent conductive film 17. In addition, even in a case where a leak path is formed between the fourth insulating film 106 and the sixth insulating film 108 due to the permeation of moisture, a leakage current does not flow between the upper electrode 14b and the lower electrode 14a via the transparent conductive film 17. Furthermore, in the present embodiment, since the area of the photodiode 12 covered with the 5a-th insulating film 217 and the 5b-th insulating film 227 is smaller than that of the second embodiment, the incident efficiency of the scintillation light on the photoelectric conversion layer 15 can be improved, and the sensor sensitivity can be improved.

Figure 12A:
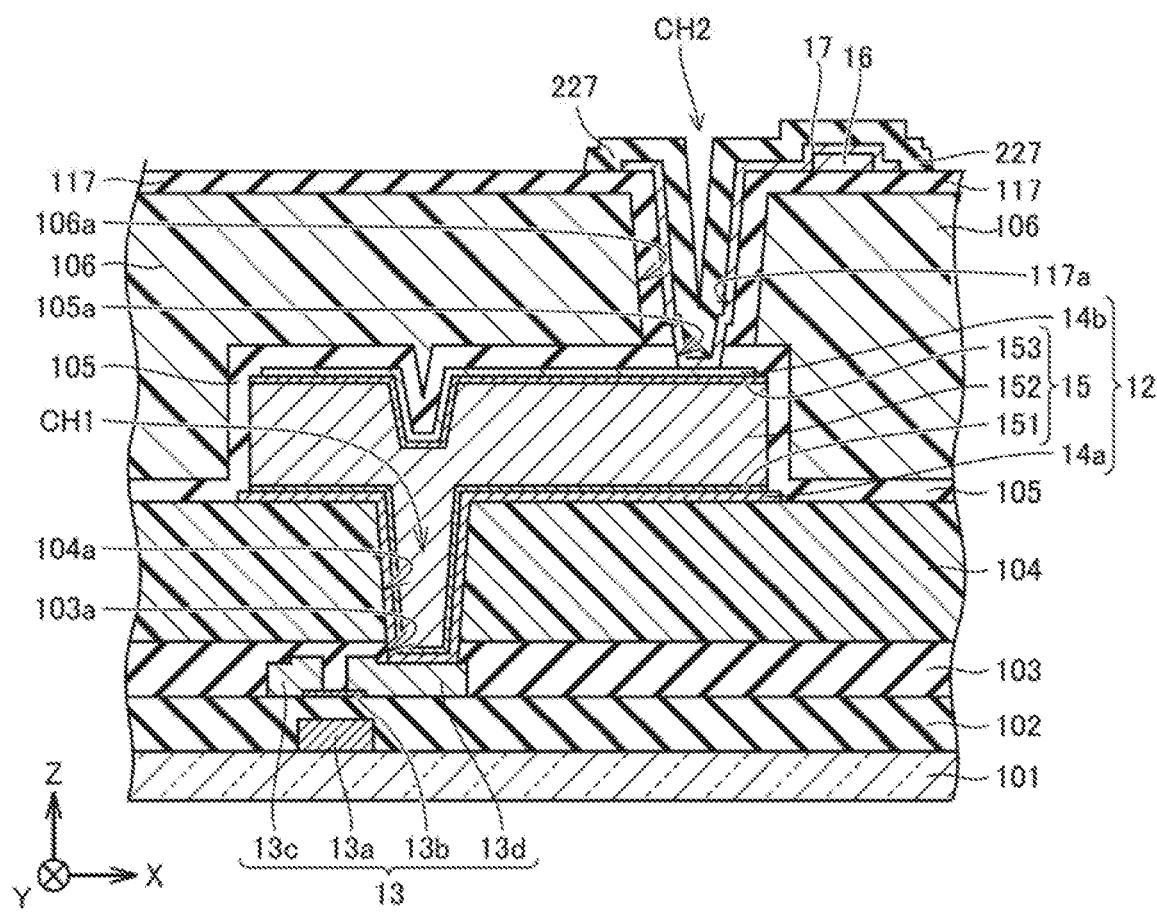
FIG. 12A is a cross-sectional view illustrating a step of manufacturing the pixel of the active matrix substrate illustrated in FIG. 11 and is a cross-sectional view illustrating a step of patterning the 5b-th insulating film illustrated in FIG. 5S.

In this case, after performing the steps in FIGS. 5A to 5S described above, a photolithography method and dry etching are performed to pattern the 5b-th insulating film 127, and thus the 5b-th insulating film 227 is formed (see FIG. 12A).

Figure 12B:
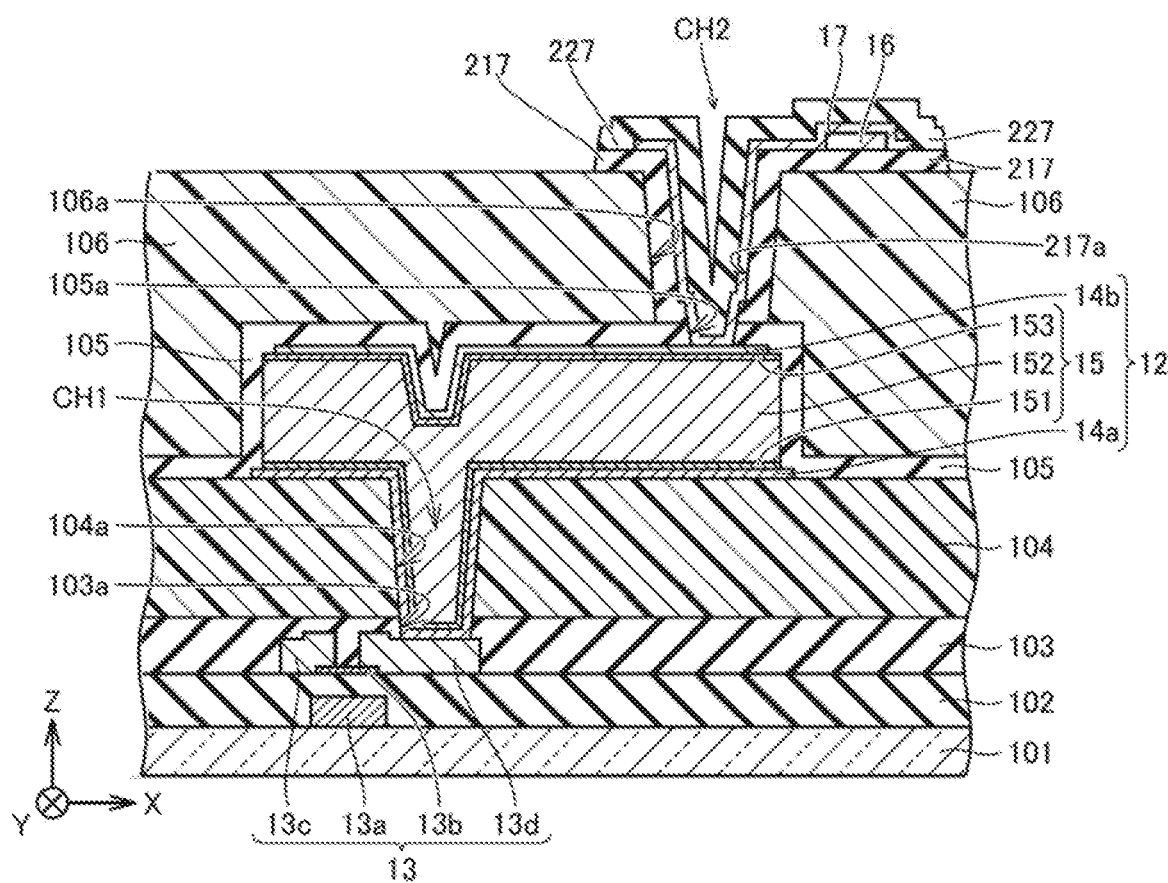
FIG. 12B is a cross-sectional view illustrating a step of patterning the 5a-th insulating film illustrated in FIG. 12A.

Thereafter, the 5a-th insulating film 217 is formed by performing a photolithography method and dry etching, and patterning the 5a-th insulating film 117 (see FIG. 12B). Then, the active matrix substrate IC (FIG. 11) is formed by performing the step in FIG. 5T described above.

Note that while the example in which the 5a-th insulating film 117 and the 5b-th insulating film 127 are patterned separately in each of the steps illustrated in FIGS. 12A and 12B is described above, the 5a-th insulating film 117 and the 5b-th insulating film 127 may be patterned simultaneously. That is, after the step illustrated in FIG. 5S, the 5a-th insulating film 217 and the 5b-th insulating film 227 may be formed by performing a photolithography method and dry etching, and simultaneously etching the 5a-th insulating film 117 and the 5b-th insulating film 127. According to the above-mentioned configuration, the number of steps can be reduced.

In addition, even in the present embodiment, similar to the application example of the first embodiment described above, the step in FIG. 6A may be performed after the step in FIG. 5J, and then the step in FIG. 5K and the subsequent steps may be performed.

Embodiments have been described above, but the embodiments described above are merely exemplary. Thus, the active matrix substrate and the imaging panel according to the present disclosure are not limited to the embodiments described above, and the embodiments described above can be appropriately modified and performed without departing from the spirit of the present disclosure.

(1) While examples in which the 5a-th insulating film and the 5b-th insulating film are provided in each pixel are described in the above embodiments, it may be sufficient for at least the 5a-th insulating film to be disposed. In this case, since the transparent conductive film 17 is in direct contact with the sixth insulating film 108, when a leak path is formed between the fourth insulating film 106 and the sixth insulating film 108 due to permeation of moisture, a leakage current may flow between the upper electrode 14b and the lower electrode 14a via the transparent conductive film 17. However, since the transparent conductive film 17 is not direct contact with the fourth insulating film 106, even in a case where a leak path is formed through the surface of the third insulating film 105 and the discontinuous portion of the third insulating film 105, a leakage current does not flow between the upper electrode 14b and the lower electrode 14a via the transparent conductive film 17.

(2) While examples in which the PIN type diode is used as the photoelectric conversion layer 15 are described in the above embodiments, the photoelectric conversion layer 15 may be a p-n junction diode in which the p-type semiconductor layer and the n-type semiconductor layer are jointed.

Figure 13:
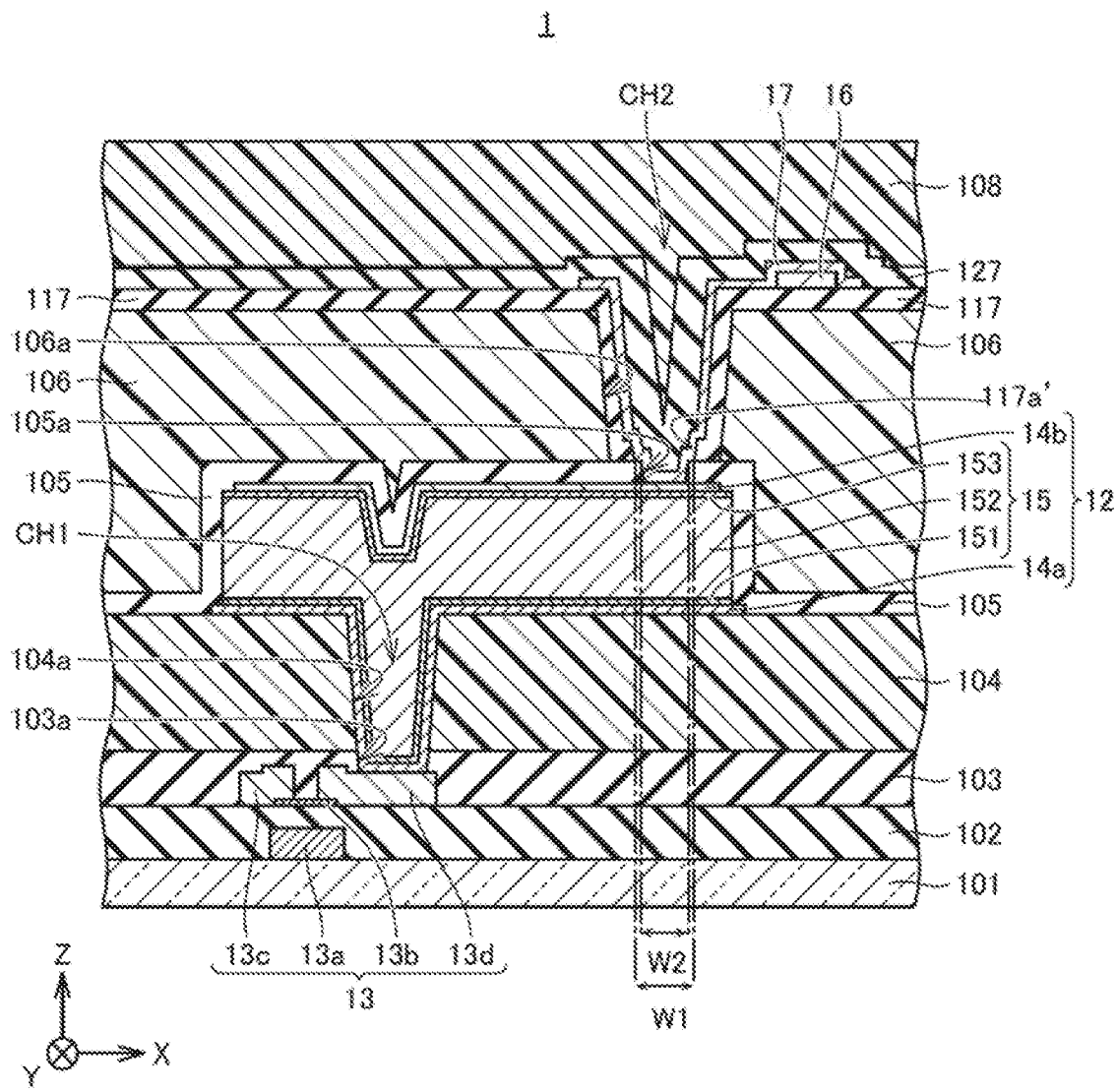
FIG. 13 is a schematic cross-sectional view of a pixel of an active matrix substrate in a third modified example.

(3) In the embodiments described above, for example, in FIG. 4, the opening width of the opening 117a of the 5a-th insulating film 117 at a position closer to the third insulating film 105 is substantially the same as the opening width of the opening 105a of the third insulating film 105. However, for example, as illustrated in FIG. 13, an opening width W1 of an opening 117a' of the 5a-th insulating film 117 at a position closer to the third insulating film 105 may be greater than an opening width W2 of the opening 105a of the third insulating film 105. In other words, an opening needs only to pass thorough the 5a-th insulating film 117 and the third insulating film 105, and the opening width of the 5a-th insulating film 117 and the opening width of the third insulating film 105 may not necessarily be equal.

The active matrix substrate described above, an imaging panel provided with the same, and a method for manufacturing the active matrix substrate can be described as follows.

An active matrix substrate according a first configuration includes a substrate, a first electrode disposed on the substrate, a photoelectric conversion element disposed on the first electrode, a second electrode disposed on the photoelectric conversion element, a first inorganic insulating film including a first opening on the second electrode and covering surfaces of the first electrode, the second electrode, and the photoelectric conversion element, a first organic insulating film provided on the first inorganic insulating film and including a second opening at a position overlapping the first opening in a plan view, a second inorganic insulating film covering a surface of the first organic insulating film inside the second opening and including a third opening at a position overlapping the first opening in a plan view, and a conductive film provided on the second inorganic insulating film and in contact with the second electrode via the first opening.

According to the first configuration, the photoelectric conversion element is provided between the first electrode and the second electrode. The surfaces of the first electrode, the second electrode, and the photoelectric conversion element are covered with the first inorganic insulating film including the first opening on the second electrode. The first organic insulating film is provided on the first inorganic insulating film, and the first organic insulating film includes the second opening at a position overlapping the first opening in a plan view. The second inorganic insulating film includes the third opening at a position overlapping the first opening in a plan view and covers a surface of the first organic insulating film inside the second opening. Since the conductive film is provided on the second inorganic insulating film, the conductive film is not in direct contact with the first organic insulating film.

In a case that a leak path is formed between the first electrode and the second electrode, a leakage current of the photoelectric conversion element readily flows, and the detection sensitivity decreases. For example, in a case that moisture permeates the first organic insulating film, a leak path is easily formed in the first inorganic insulating film including such a defect that a portion of the first inorganic insulating film covering the vicinity of the first electrode is formed discontinuously. That is, when the surface of the first inorganic insulating film is exposed to moisture due to the moisture that has entered the first organic insulating film, and the moisture enters the defective portion of the first inorganic insulating film, a leak path between the surface of the first inorganic insulating film and the defective portion of the first inorganic insulating film is formed. In a case that the conductive film is in direct contact with the first organic insulating film, a leak path to the conductive film is formed, and a leakage current readily flows between the second electrode and the first electrode via the conductive film. In the first configuration, since the conductive film is not in direct contact with the first organic insulating film, a leak path to the conductive film is not formed, and a leakage current is less likely to flow between the second electrode and the first electrode via the conductive film.

In the first configuration, the active matrix substrate may further include a third inorganic insulating film covering the conductive film and a second organic insulating film covering the third inorganic insulating film (a second configuration).

According to the second configuration, since the conductive film is covered with the third inorganic insulating film and is not in direct contact with the second organic insulating film, even in a case where moisture permeates the first organic insulating film and the second organic insulating film, a leakage current is less likely to flow between the second electrode and the first electrode via the conductive film.

In the second configuration, at least one of the second inorganic insulating film or the third inorganic insulating film may cover a part of an area in the photoelectric conversion element that does not overlap the second opening in a plan view (a third configuration).

According to the third configuration, compared to a case in which the entire area in the photoelectric conversion element that does not overlap the second opening in a plan view is covered with the second inorganic insulating film and the third inorganic insulating film, the incident efficiency of the photoelectric conversion element is improved, and the sensor sensitivity can be improved.

In any one of the first to third configurations, the active matrix substrate may further include a switching element on the substrate, the first electrode may be connected to a drain electrode of the switching element, and the second electrode may be applied with a bias voltage via the conductive film (a fourth configuration).

An X-ray imaging panel may include the active matrix substrate of any one of the first to fourth configurations and a scintillator configured to convert an emitted X-ray into fluorescence (a fifth configuration).

According to the fifth configuration, the leakage current of the photoelectric conversion element is reduced, and a variation in the detection sensitivity to the X-rays can be reduced.

A method for manufacturing an active matrix substrate includes forming a first electrode on a substrate, forming a photoelectric conversion element on the first electrode, forming a second electrode on the photoelectric conversion element, forming a first inorganic insulating film including a first opening on the second electrode and covering surfaces of the first electrode, the second electrode, and the photoelectric conversion element, forming, on the first inorganic insulating film, a first organic insulating film including a second opening at a position overlapping the first opening in a plan view, forming a second inorganic insulating film covering a surface of the first organic insulating film in the second opening and including a third opening at a position overlapping the first opening in a plan view, and forming, on the second inorganic insulating film, a conductive film in contact with the second electrode in the first opening (a first manufacturing method).

According to the first manufacturing method, the photoelectric conversion element is formed between the first electrode and the second electrode, and the surfaces of the first electrode, the second electrode, and the photoelectric conversion element are covered with the first inorganic insulating film including the first opening on the second electrode. The first organic insulating film is formed on the first inorganic insulating film, and the first organic insulating film includes a second opening at a position overlapping the first opening in a plan view. The second inorganic insulating film includes a third opening at a position overlapping the first opening in a plan view and covers a surface of the first organic insulating film inside the second opening. The conductive film is provided on the second inorganic insulating film and is not in direct contact with the first organic insulating film.

In the step of forming the first inorganic insulating film, a portion covering the vicinity of the first electrode may have such a defect that the first inorganic insulating film is formed with a thin film thickness, or is formed discontinuously. When moisture permeates the first organic insulating film, the surface of the first inorganic insulating film is exposed to moisture, and moisture readily enters the defect in the first inorganic insulating film. That is, a leak path is easily formed through the surface of the first inorganic insulating film and the defective portion of the first inorganic insulating film. With the present manufacturing method, since the conductive film is not in direct contact with the first organic insulating film, a leak path to the conductive film is not formed, and a leakage current is less likely to flow between the second electrode and the first electrode via the conductive film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
    a substrate;
    a first electrode disposed on the substrate;
    a photoelectric conversion element disposed on the first electrode;
    a second electrode disposed on the photoelectric conversion element;
    a first inorganic insulating film including a first opening on the second electrode and covering surfaces of the first electrode, the second electrode, and the photoelectric conversion element;
    a first organic insulating film provided on the first inorganic insulating film and including a second opening at a position overlapping the first opening in a plan view;
    a second inorganic insulating film covering a surface of the first organic insulating film inside the second opening and including a third opening at a position overlapping the first opening in a plan view; and
    a conductive film provided on the second inorganic insulating film and in contact with the second electrode in the first opening.

2. The active matrix substrate according to claim 1 further comprising:
    a third inorganic insulating film covering the conductive film; and
    a second organic insulating film covering the third inorganic insulating film.

3. The active matrix substrate according to claim 2,
    wherein at least one of the second inorganic insulating film or the third inorganic insulating film covers a part of an area in the photoelectric conversion element that does not overlap the second opening in a plan view.

4. The active matrix substrate according to claim 1 further comprising:
    a switching element on the substrate,
    wherein the first electrode is connected to a drain electrode of the switching element, and
    the second electrode is applied with a bias voltage via the conductive film.

5. An imaging panel comprising:
    the active matrix substrate according to claim 1; and
    a scintillator configured to convert an emitted X-ray into fluorescence.

6. A method for manufacturing an active matrix substrate comprising:
    forming a first electrode on a substrate;
    forming a photoelectric conversion element on the first electrode;
    forming a second electrode on the photoelectric conversion element;
    forming a first inorganic insulating film including a first opening on the second electrode and covering surfaces of the first electrode, the second electrode, and the photoelectric conversion element;
    forming, on the first inorganic insulating film, a first organic insulating film including a second opening at a position overlapping the first opening in a plan view;
    forming a second inorganic insulating film covering a surface of the first organic insulating film in the second opening and including a third opening at a position overlapping the first opening in a plan view; and
    forming, on the second inorganic insulating film, a conductive film in contact with the second electrode in the first opening.

* * * * *